US012609146B2

(12) United States Patent
Park et al.

(10) Patent No.: US 12,609,146 B2
(45) Date of Patent: Apr. 21, 2026

(54) MEMORY SYSTEM PERFORMING HIERARCHICAL DUTY CYCLE ADJUSTER TRAINING AND DUTY CYCLE ADJUSTER TRAINING METHOD THEREOF

(71) Applicant: Samsung Electronics Co., Ltd., Suwon-si (KR)

(72) Inventors: Ki-Seok Park, Suwon-si (KR); Do-Han Kim, Suwon-si (KR); Minsu Bae, Suwon-si (KR); Chang-Hyun Bae, Suwon-si (KR); Young-Hoon Son, Suwon-si (KR); Hye-Seung Yu, Suwon-si (KR); Yoenhwa Lee, Suwon-si (KR); Daihyun Lim, Suwon-si (KR); Insu Choi, Suwon-si (KR); Kideok Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 32 days.

(21) Appl. No.: 18/581,187

(22) Filed: Feb. 19, 2024

(65) Prior Publication Data

US 2024/0404570 A1 Dec. 5, 2024

(30) Foreign Application Priority Data

Jun. 2, 2023 (KR) ........................ 10-2023-0071689
Aug. 31, 2023 (KR) ........................ 10-2023-0115410

(51) Int. Cl.
*G11C 7/22* (2006.01)
*G11C 7/10* (2006.01)
(52) U.S. Cl.
CPC ............ *G11C 7/222* (2013.01); *G11C 7/1063* (2013.01); *G11C 7/1093* (2013.01)

(58) Field of Classification Search
CPC .................................. G11C 7/222; G11C 7/22
USPC ........................................................ 365/233.1
See application file for complete search history.

(56) References Cited

U.S. PATENT DOCUMENTS

| | | | |
|---|---|---|---|
| 10,395,704 B2 * | 8/2019 | Lee ......................... | G11C 16/08 |
| 10,580,476 B2 * | 3/2020 | King .................... | G11C 29/023 |
| 11,003,370 B2 | 5/2021 | Kim et al. | |
| 2021/0390991 A1 * | 12/2021 | Kumar ................. | G11C 7/1066 |
| 2022/0190844 A1 | 6/2022 | Rose et al. | |
| 2022/0270657 A1 | 8/2022 | Kim | |
| 2022/0270665 A1 | 8/2022 | Park | |

(Continued)

FOREIGN PATENT DOCUMENTS

| | | |
|---|---|---|
| JP | 2020-052677 A | 4/2020 |
| KR | 2022-0121385 A | 9/2022 |

(Continued)

OTHER PUBLICATIONS

Extended European Search Report dated Oct. 10, 2024 issued in European Patent Application No. 24178193.9-1211.

*Primary Examiner* — Muna A Techane
(74) *Attorney, Agent, or Firm* — Harness, Dickey & Pierce, P.L.C.

(57) ABSTRACT

A method of training a memory device is provided. In first to third DCA training steps, a score for each of first to third DCA code combinations is calculated based on an eye window size of a data signal, and in response to a tie occurring among scores, a DCA code combination is selected based on the sum of an even-eye window minimum value and an odd-eye window minimum value of the data signal.

20 Claims, 20 Drawing Sheets

1000

(56)                    References Cited

U.S. PATENT DOCUMENTS

2023/0029968 A1      2/2023  Chang et al.
2023/0147016 A1      5/2023  Kim et al.
2023/0317155 A1*   10/2023  Takizawa ........... G11C 11/1659
                                                    365/148

FOREIGN PATENT DOCUMENTS

KR        2023-0019596 A      2/2023
KR        2023-0067456 A      5/2023

* cited by examiner

FIG. 4

| Internal CLK / Step | Hierarchical DCA Training | | |
|---|---|---|---|
| | QCLK | IBCLK | QBCLK |
| STEP_1 | -4, 0, 4 sweep | -4, 0, 4 sweep | -4, 0, 4 sweep |
| | Based on default offset value (Q=0, IB=0, QB=0) | | |
| STEP_2 | -2, 0, 2 sweep | -2, 0, 2 sweep | -2, 0, 2 sweep |
| | Based on improved offset value of STEP_1 | | |
| STEP_3 | -1, 0, 1 sweep | -1, 0, 1 sweep | -1, 0, 1 sweep |
| | Based on improved offset value of STEP_2 | | |

FIG. 8

Tie-break algorithm

| DCA index | DCA code combination | Even_min EW | Odd_min EW | minEW | Sum(Even/Odd) |
|---|---|---|---|---|---|
| 0 | (-4, -4, -4) | 36 | 40 | 36 | 76 |
| 1 | (-4, -4, 0) | 39 | 37 | 37 | 76 |
| 2 | (-4, -4, 4) | 38 | 33 | 33 | 71 |
| 3 | (-4, 0, -4) | 37 | 38 | 37 | 75 |
| 4 | (-4, 0, 0) | 39 | 38 | 38 | 77 |
| 5 | (-4, 0, 4) | 41 | 35 | 35 | 76 |
| 6 | (-4, 4, -4) | 37 | 36 | 36 | 73 |
| 7 | (-4, 4, 0) | 38 | 35 | 35 | 73 |
| 8 | (-4, 4, 4) | 41 | 34 | 34 | 75 |
| 9 | (0, -4, -4) | 38 | 43 | 38 | 81 |
| 10 | (0, -4, 0) | 39 | 41 | 39 | 80 |
| 11 | (0, -4, 4) | 39 | 36 | 36 | 75 |
| 12 | (0, 0, -4) | 37 | 40 | 37 | 77 |
| 13 | (0, 0, 0) | 40 | 41 | 40 | 81 |
| 14 | (0, 0, 4) | 41 | 37 | 37 | 78 |
| 15 | (0, 4, -4) | 37 | 38 | 37 | 75 |
| 16 | (0, 4, 0) | 39 | 38 | 38 | 77 |
| 17 | (0, 4, 4) | 43 | 36 | 36 | 79 |
| 18 | (4, -4, -4) | 38 | 45 | 38 | 83 |
| 19 | (4, -4, 0) | 38 | 43 | 38 | 81 |
| 20 | (4, -4, 4) | 38 | 39 | 38 | 77 |
| 21 | (4, 0, -4) | 38 | 43 | 38 | 81 |
| 22 | (4, 0, 0) | 40 | 43 | 40 | 83 |
| 23 | (4, 0, 4) | 40 | 41 | 40 | 81 |
| 24 | (4, 4, -4) | 38 | 39 | 38 | 77 |
| 25 | (4, 4, 0) | 41 | 39 | 39 | 80 |
| 26 | (4, 4, 4) | 43 | 40 | 40 | 83 | case A (row index 13)

case B (row index 22) — Select

S150 Start

Write second fine DCA code combination of Q, IB, QB — S151

Get data margin of UIs using PRBS pattern — S152

Last case ? — S153

No → Select next DCA combination — S154

Yes

Generate score for each DCA cases — S155

Tie score esixt? — S156

Yes → Apply Tie-break algorithm — S157

No

Select improved DCA code — S158

Set memory device with Fine2 DCA code — S159

S150 End

MEMORY SYSTEM PERFORMING HIERARCHICAL DUTY CYCLE ADJUSTER TRAINING AND DUTY CYCLE ADJUSTER TRAINING METHOD THEREOF

CROSS-REFERENCE TO RELATED APPLICATIONS

This application claims priority under 35 U.S.C. § 119 to Korean Patent Application No. 10-2023-0071689 filed on Jun. 2, 2023, and Korean Patent Application No. 10-2023-0115410 filed on Aug. 31, 2023 in the Korean Intellectual Property Office, the disclosures of each of which are incorporated by reference herein in their entireties.

BACKGROUND

Various example embodiments described herein relates to a semiconductor memory device, and more specifically, to a memory system including a memory device trained by adjusting a duty cycle adjuster (DCA) code, and a DCA training method thereof.

Recently, various mobile devices and/or electronic devices such as one or more of smartphones, desktop computers, laptop computers, tablet PCs, and wearable devices are widely used. These electronic devices usually include semiconductor memory devices for storing data. As an example of a semiconductor memory device, a dynamic random access memory (DRAM) device, which is a volatile memory, stores data using charges stored in a capacitor.

As the input/output speed of memory devices tends to increase, the signal integrity (SI) characteristics of data signal (DQ) input at high speeds have become relatively worse. One approach to solve this signal integrity problem is a training method using a duty cycle adjuster (DCA). Through DCA training, the read margin of the data signal DQ or data strobe signal (DQS) can be increased by adjusting the internal clock of the memory device using DCA code.

However, excessive time delay may occur in setting the improved or optimal duty cycle through such DCA training. Additionally or alternatively, if the command sequence does not satisfy the even condition (Command Even Gap violation), application of the DCA code may fail.

SUMMARY

Various example embodiments provide a memory system that performs hierarchical DCA training that can reduce training time and provide a high read margin, and a DCA training method thereof.

According to some example embodiments, a method of training a memory device to adjust an eye window of a data signal according to a written duty cycle adjuster (DCA) code comprises performing a first DCA training step on the memory device using first DCA code combinations with a first offset size to adjust the duty cycle of each of internal clock signals QCLK, IBCLK, and QBCLK, performing a second DCA training step on the memory device using second DCA code combinations with a second offset size under conditions in which the memory device is set according to a result of the first DCA training step, and performing a third DCA training step on the memory device using third DCA code combinations with a third offset size under conditions in which the memory device is set according to a result of the second DCA training step. In the first to third DCA training steps, the method includes calculating a score for each of the first to third DCA code combinations based on an eye window size of a data signal, and in response to a tie occurring among scores, a DCA code combination is selected based on the sum of an even-eye window minimum value and an odd-eye window minimum value of the data signal.

Alternatively or additionally according to various example embodiments, a memory system configured to adjust duty cycles of four internal clock signals through a duty cycle adjuster (DCA) code comprises, a memory device configured to generate a data signal or a data strobe signal with duty cycle changes in response to the DCA code, and a memory controller configured to perform hierarchical DCA training on the memory device to select an improved DCA code and set the memory device using the improved DCA code. The memory controller is configured to perform a first DCA training step on the memory device using first DCA code combinations with a first offset size to adjust the duty cycle of each of the internal clock signals, and to perform a second DCA training step on the memory device using second DCA code combinations with a second offset size under conditions in which the memory device is set according to a result of the first DCA training step.

Alternatively or additionally according to various example embodiments, a method of training a memory device comprises, performing first DCA training on the memory device using first DCA code combinations with a first offset size for adjusting the duty cycle of each of a plurality of internal clock signals, and performing second DCA training on the memory device using second DCA code combinations with a second offset size under conditions in which the memory device is set according to a results of the first DCA training. A maximum value of the first offset size is greater than maximum value of the second offset size, and the method includes calculating scores based on eye window size of data signal corresponding to each of the first to second DCA code combinations in the first to second DCA training.

BRIEF DESCRIPTION OF THE FIGURES

The above and other objects and features of example embodiments will become apparent by describing in detail embodiments thereof with reference to the accompanying drawings.

FIG. 4 is a table showing an example of a hierarchical DCA training method according to various example embodiments.

FIG. 8 is a table explaining the tie-breaking algorithm corresponding to the tie-breaking technology according to various example embodiments.

FIG. 16 is a block diagram showing a computing system 3000 according to various example embodiments.

FIG. 18 is a block diagram showing another embodiment of a memory system using hierarchical DCA training of various example embodiments.

DETAILED DESCRIPTION

It is to be understood that both the foregoing general description and the following detailed description are by examples, and it is to be considered that an additional description of the claimed invention is provided. Reference signs are indicated in detail in various embodiments, examples of which are indicated in the reference drawings. Wherever possible, the same reference numbers are used in the description and drawings to refer to the same or like parts.

Figure 1:
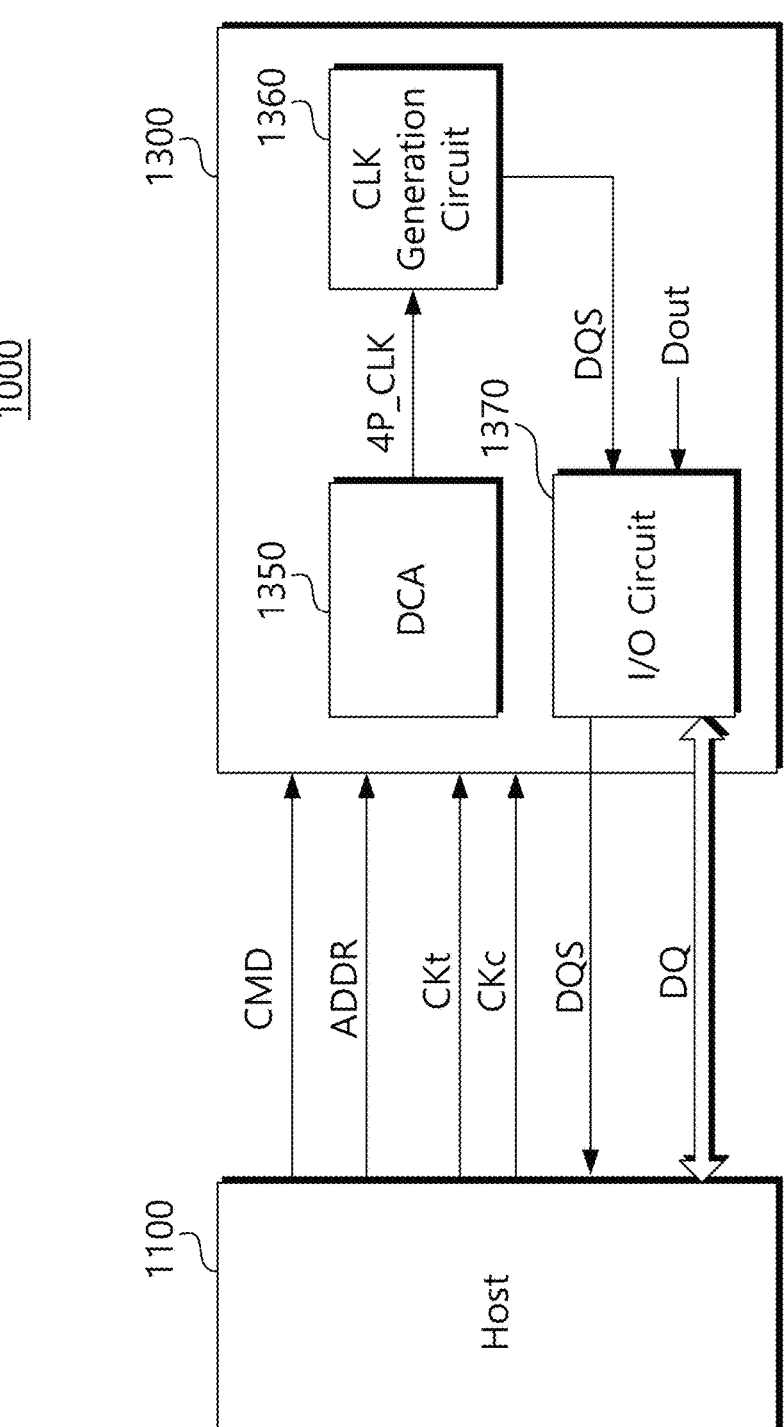
FIG. 1 is a block diagram showing the structure of a memory system according to various example embodiments.

FIG. 1 is a block diagram showing the structure of a memory system according to various example embodiments. Referring to FIG. 1, the memory system 1000 includes a host 1100 and a memory device 1300. The host 1100 performs duty cycle adjuster (DCA) training of the memory device 1300 to adjust a duty cycle (or a duty ratio) of the data signal DQ and/or of the data strobe signal DQS. The DCA training may be applied, for example, during booting and/or initialization of the memory system 1000, and/or during a test process, but the timing of application of DCA training is not limited to the description here.

The host 1100 may write data to the memory device 1300 and/or may perform an access operation to read data stored in the memory device 1300. The host 1100 may generate clock signals (CKt, CKc), commands CMD, and addresses ADDR for writing data to the memory device 1300 and/or for reading data stored in the memory device 1300. The host 1100 may be or may include or be included in at least one of a chipset for controlling the memory device 1300, a system-on-chip SoC such as a mobile application processor AP, a CPU, a GPU, or a test device.

For example, the host 1100 may adjust the duty cycle of the data signal DQ and/or of the data strobe signal DQS output from the memory device 1300 through DCA training. The memory device 1300 generates four-phase internal clocks (ICLK, QCLK, IBCLK, and QBCLK) whose duty cycle is adjusted according to the DCA code. The size of the eye window EW of the data signal DQ of the memory device 1300 is adjusted by adjusting the duty cycle of the four phases of internal clocks (one or more of ICLK, QCLK, IBCLK, and QBCLK). For example, through DCA code adjustment, the host 1100 can adjust the duty cycle of the internal clocks (ICLK, QCLK, IBCLK, and QBCLK) of the memory device 1300. This indicates that the signal integrity (SI) characteristics of the data strobe signal DQS and the data signal DQ output from the memory device 1300 can be adjusted. Adjustment of the duty cycle of one or more of the four phases of internal clocks (ICLK, QCLK, IBCLK, and QBCLK) is a factor that determines the eye window size or signal integrity of the data signal DQ.

In particular, the host 1100 can adjust clock skew between internal clock signals (ICLK, QCLK, IBCLK, and QBCLK) through hierarchical DCA training. By adjusting the clock skew between internal clock signals (ICLK, QCLK, IBCLK, and QBCLK), the eye window EW size of the data strobe signal DQS or data signal DQ can be increased, e.g., maximized. The hierarchical DCA training of example embodiments refers to a technique of training a DCA code starting from a large offset and moving to a small offset.

For example, hierarchical DCA training can proceed through a three-step or four-step or greater than four-step procedure. In general, the skew of the first internal clock signal ICLK is fixed, so adjustment of the duty cycle using the DCA code may not be possible. Therefore, when hierarchical DCA training is performed in three steps, in the first step, a DCA code offset of magnitude '−4, 0, 4' is used to adjust the skew of each of the second to fourth internal clock signals QCLK, IBCLK, and QBCLK to perform the widest range of skew adjustments. For example, DCA training is performed using a combination of internal clock signals QCLK, IBCLK, and QBCLK where each DCA code has an offset of '−4, 0, or 4'. Then, the output data signal DQ is checked and the DCA code combination corresponding to the largest eye window is selected. Ultimately, the first step STEP_1 may be referred to as coarse training using the widest range of offsets. If a tie score situation occurs, the improved or optimal value can be selected by applying a tie-break algorithm, which may or may not be a randomized algorithm. According to the tie-break algorithm, a DCA code combination is selected based on a sum of an even-eye window minimum value and an odd-eye window minimum value. The tie break algorithm will be explained in more detail with reference to the drawings described later.

After the memory device 1300 is set with the improved or optimal DCA code selected in the first step STEP_1, DCA training corresponding to the second step STEP_2 continues. In the second step STEP_2, skew adjustment is performed in a smaller range than the first step STEP_1 by inputting DCA code offsets of '−2, 0, 2' for each of the internal clock signals QCLK, IBCLK, and QBCLK. For example, the second step STEP_2 corresponds to first fine (or finer) training that performs more precise skew adjustment based on the DCA code determined in the first step STEP_1. If a tie occurs in the second step STEP_2, a tie-break algorithm that can select the improved or optimal value can be applied. The tie-breaking algorithm used after the second step STEP_2 may or may not be the same as the tie-breaking algorithm used after the first step STEP_1.

After the memory device 1300 is set with the improved or optimal DCA code selected in the second step STEP_2, DCA training corresponding to the third step STEP_3 continues. In the third step STEP_3, skew adjustment in a smaller range than the second step STEP_2 is performed by inputting DCA code offsets of '−1, 0, 1' for each of the internal clock signals QCLK, IBCLK, and QBCLK. For example, the third step STEP_3 corresponds to second fine training that performs more precise skew adjustment based on the DCA code determined in the second step STEP_2. If a tie occurs in the third step STEP_3, a tie-break algorithm that can select the improved or optimal value can be applied The tie-breaking algorithm after the third step STEP_3 may or may not be the same as the tie-breaking algorithm after the second step STEP_2 or after the first step STEP_1.

The three-step hierarchical DCA training by the host 1100 is not limited to the description here. Hierarchical DCA training can be applied in four or more steps. For example, hierarchical DCA training may be applied using four or more steps. Through hierarchical DCA training, there is no or a reduced possibility of inter-phase DCA codes being mixed even if the command even gap, which may be important in the order of even/odd unit intervals, is not observed. And training patterns such as the tie-break algorithm and pseudo-random binary sequence PRBS used in hierarchical DCA training are applied. Therefore, the eye window EW size of the data signal DQ can be improved upon, or secured or more likely secured, with high accuracy.

The memory device 1300 may perform hierarchical DCA training under the control of the host 1100. The memory device 1300 generates a 4-phase internal clock 4P_CLK whose duty cycle is adjusted according to the DCA code written by the host 1100. The 4-phase internal clock 4P_CLK may be internal clock signals (ICLK, QCLK, IBCLK, and QBCLK) each having a 90° phase difference in such an order. In some example embodiments, one internal clock signal (e.g., ICLK) may have a fixed duty cycle, while the duty cycle of the remaining three internal clock signals QCLK, IBCLK, and QBCLK can be adjusted using DCA codes. For this purpose, the memory device 1300 may include a duty cycle adjuster 1350, a clock generator 1360, and an input/output circuit 1370.

The duty cycle adjuster 1350 generates a 4-phase internal clock signal 4P_CLK whose duty cycle is adjusted according to the DCA code written by host 1100. The 4-phase internal clock signal 4P_CLK may be generated based on the clock signals (CKt, CKc) or write clock signals (WCKt, WCKc) provided from the host 1100. In general, the first internal clock signal ICLK may be a fixed internal clock signal whose duty cycle is not adjusted with the DCA code. On the other hand, the second internal clock signal QCLK has a phase difference of 90° from the first internal clock signal ICLK, and the third internal clock signal IBCLK has a phase difference of 180° from the first internal clock signal ICLK, the fourth internal clock signal QBCLK has a phase difference of 270° from the first internal clock signal ICLK. The duty cycle adjuster 1350 may adjust the duty cycle of the second to fourth internal clock signals according to the written DCA code.

The clock generation circuit 1360 generates a clock signal and/or a data strobe signal DQS according to the 4-phase internal clock signal 4P_CLK provided from the duty cycle regulator 1350. The clock generation circuit 1360 may increase or decrease the even clock duty cycle ratio of the data strobe signal DQS according to the second internal clock QCLK of the increased or decreased duty cycle. Likewise, the clock generation circuit 1360 may increase or decrease the even clock duty cycle ratio of the data strobe signal DQS according to the third internal clock IBCLK or fourth internal clock QBCLK having an increasing or decreasing duty cycle.

The input/output circuit 1370 may output the read data Dout as a data signal DQ using a clock signal or a data strobe signal DQS provided by the clock generation circuit 1360. The data signal DQ is transmitted to the host 1100 in synchronization with the data strobe signal DQS generated by the clock generation circuit 1360.

Figure 2:
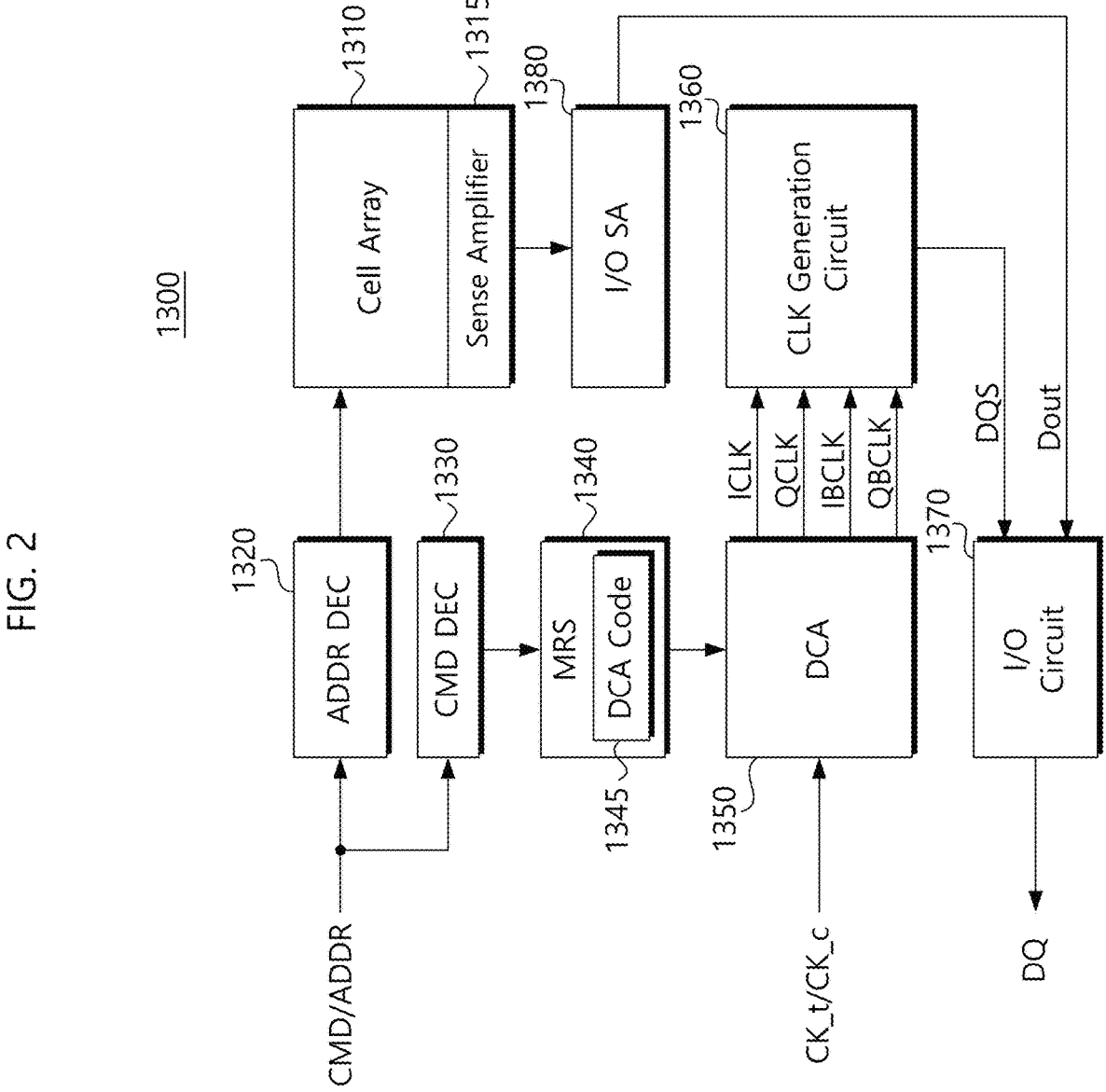
FIG. 2 is a block diagram showing the memory device of FIG. 1.

FIG. 2 is a block diagram showing the memory device of FIG. 1. Referring to FIG. 2, the memory device 1300 includes a cell array 1310, a sense amplifier 1315, an address decoder 1320, a command decoder 1330, a mode register set 1340, a duty cycle adjuster 1350, a clock generation circuit 1360, an input/output circuit 1370, and an input/output sense amplifier 1380.

The cell array 1310 includes a plurality of memory cells, such as but not limited to nonvolatile memory cells and/or volatile memory cells. In some example embodiments, the cell array 1310 may include redundancy cells and/or dummy cells; example embodiments are not limited thereto. Write data received through the input/output sense amplifier 1380 may be written to the plurality of memory cells by the sense amplifier 1315, while the data written to the memory cell is selected by the command CMD and address ADDR of the host 1100 and sensed by the sense amplifier 1315. Data sensed by the sense amplifier 1315 may be transmitted to the input/output sense amplifier 1380 and then to the input/output circuit 1370.

The address decoder 1320 may receive the address ADDR of the memory cell being accessed. When data is stored in a memory cell and/or data is read from the memory cell, the address ADDR may be transmitted to the cell array 1310 as a row address and column address through the address decoder 1320.

The command decoder 1330 can decode the command CMD input from the outside. The command decoder 1330 can access the mode register set (MRS, 1340) for setting various modes and operations of the memory device 1300. The command decoder 1330 can identify the properties of the input command CMD by referring to externally applied signals (such as but not limited to one or more of /RAS, /CAS, /WE). In addition, the command decoder 1330 can write data to the mode register set 1340 according to the command CMD and address ADDR provided from the outside. For example, the DCA code provided for DCA training of the present invention is written into the mode register set 1340 by the command decoder 1330.

The mode register set 1340 sets internal mode registers in response to an MRS command and an address ADDR for specifying the operation mode of the memory device 1300. The mode register set 1340 according to various example embodiments may include a DCA code register 1345 in which a DCA code for adjusting the duty cycle of the data signal DQ and/or data strobe signal DQS is written. A mode register write MRW command may be used to write a DCA code to the DCA code register 1345.

The DCA code for each of the internal clock signals QCLK, IBCLK, and QBCLK for adjusting the duty cycle of each of the internal clock signals QCLK, IBCLK, and QBCLK is written in the DCA code register 1345. Through the writing of the DCA code, the current duty cycle of each of the internal clock signals QCLK, IBCLK, and QBCLK is adjusted to one of '+7' to '−7' steps (15 steps). For example, the duty cycle of each of the internal clock signals QCLK, IBCLK, and QBCLK can be increased or decreased by writing the corresponding DCA code. Accordingly, the even clock duty ratio and/or the odd clock duty ratio of the data signal DQ or data strobe signal DQS increases or decreases. In general, the DCA code register 1345 is set so that the first internal clock signal ICLK cannot be adjusted, and the second to fourth internal clock signals QCLK, IBCLK, and QBCLK can be adjusted. However, the range of adjustable internal clock signals is not limited to the disclosure herein.

The duty cycle adjuster 1350 generates internal clock signals ICLK, QCLK, IBCLK, and QBCLK according to the DCA code written in the mode register set 1340. The duty cycle adjuster 1350 generates internal clock signals ICLK, QCLK, IBCLK, and QBCLK using externally provided clock signals (CK_t, CK_c) and/or write clock signals (WCK_t, WCK_c).

The clock generation circuit 1360 generates a clock signal and/or a data strobe signal DQS from internal clock signals ICLK, QCLK, IBCLK, and QBCLK provided from the duty cycle regulator 1350. The clock generation circuit 1360 can increase or decrease the duty cycle ratio of the even clock and/or odd clock of the data strobe signal DQS according to the internal clock signals ICLK, QCLK, IBCLK, and QBCLK of increased or decreased duty cycle.

The input/output circuit 1370 outputs the read data Dout as a data signal DQ using a clock signal or a data strobe signal DQS provided by the clock generation circuit 1360. The data signal DQ is transmitted to the host 1100 in synchronization with the data strobe signal DQS generated by the clock generation circuit 1360.

As described above, the memory device 1300 of various example embodiments can be set to a DCA code that increases or maximizes the eye window EW of the data signal DQ through hierarchical DCA training.

Figure 3:
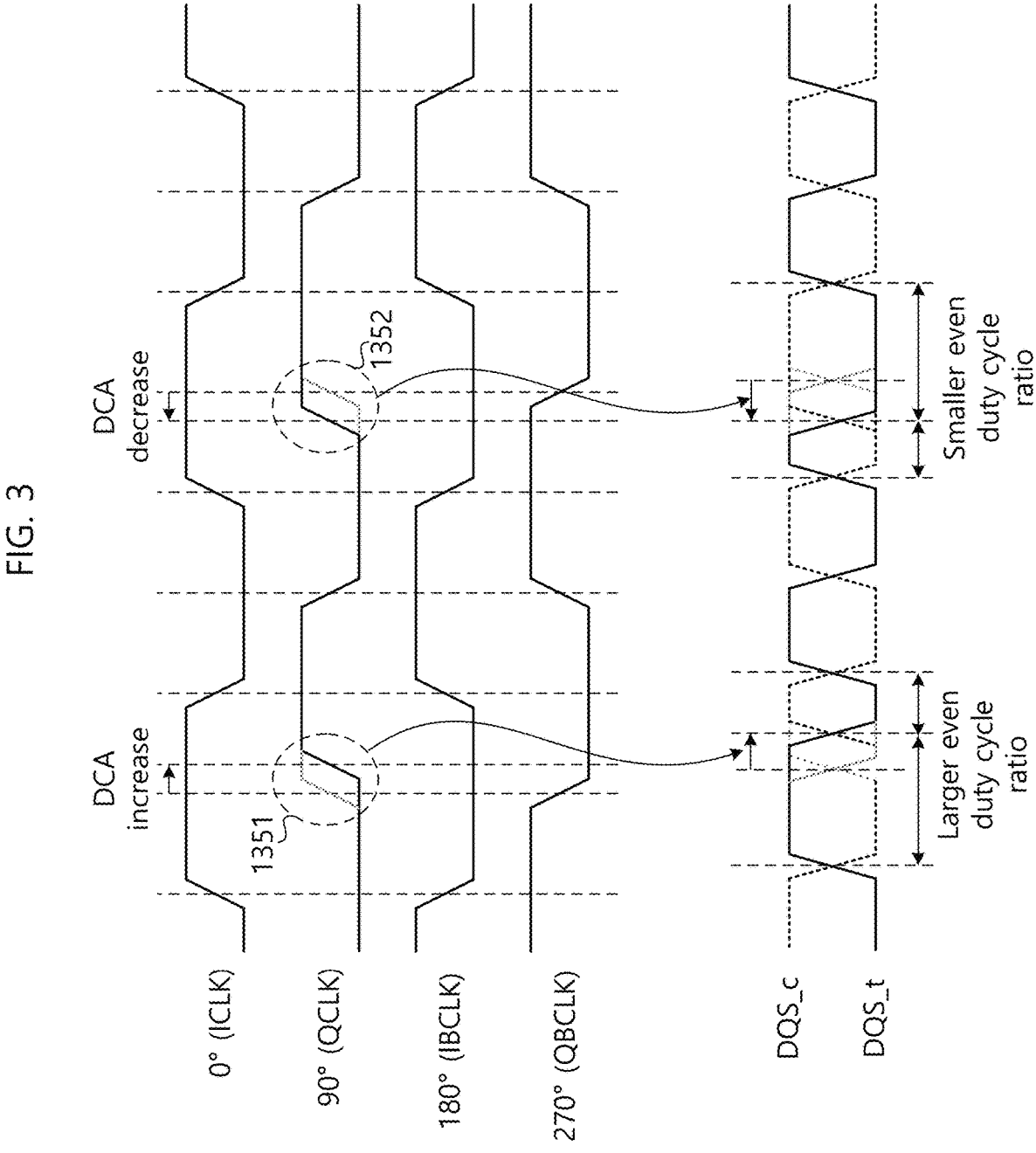
FIG. 3 is a timing diagram exemplarily showing a change in duty cycle of a data strobe signal according to DCA code adjustment in the memory device of FIG. 2.

FIG. 3 is a timing diagram exemplarily showing a change in duty cycle of a data strobe signal according to DCA code adjustment in the memory device of FIG. 2. Referring to FIG. 3, the change in the data strobe signal DQS when increasing or decreasing the DCA code of the second internal clock signal QCLK among the four phases of internal clock signals ICLK, QCLK, IBCLK, and QBCLK) is shown.

The second internal clock signal QCLK has a 90° phase difference from the first internal clock signal ICLK. It is assumed that the DCA code corresponding to the currently written second internal clock signal QCLK is in the '0' step state. Furthermore, when the DCA code is increased by the '+2' step through writing the DCA code, the rising edge of the second internal clock signal QCLK retreats as indicated by the dotted line circle 1351. The retreating rising edge of the second internal clock signal QCLK increases the size of the even duty cycle section of the data strobe signal DQS. On the other hand, if the DCA code is reduced by '−2' steps through writing the DCA code, the rising edge of the second internal clock signal QCLK advances like the dotted line 1352. The advancing rising edge of the second internal clock signal QCLK reduces the size of the even duty cycle section of the data strobe signal DQS.

In the above, the effect of writing the DCA code for adjusting the second internal clock signal QCLK among the internal clock signals ICLK, QCLK, IBCLK, and QBCLK was briefly explained. Likewise, the size of the duty cycle section of the data strobe signal DQS can be adjusted by adjusting the DCA codes of the third to fourth internal clock signals IBCLK and QBCLK.

FIG. 4 is a table showing a hierarchical DCA training method according to various example embodiments. Referring to FIG. 4, for hierarchical DCA training, a DCA sweep is performed to adjust each of the internal clock signals QCLK, IBCLK, and QBCLK in three steps (STEP_1, STEP_2, and STEP_3). Here, DCA sweep refers to an input/output operation that measures the eye window EW size of the data signal DQ output from the memory device 1300 while changing the DCA code. Here, the data pattern used for DCA training may be a random pattern such as a pseudo-random binary sequence (PRBS); however, example embodiments are not limited thereto.

In the first step STEP_1, the host 1100 performs a coarse DCA sweep for each of the internal clock signals QCLK, IBCLK, and QBCLK. For example, in the first step STEP_1, the step size (hereinafter referred to as DCA offset) of the written DCA code may be any one of '−4', '0', and '4'. For example, for DCA sweep, the DCA offset of each of the internal clock signals QCLK, IBCLK, and QBCLK is divided into 27 offset combinations {(−4, −4, −4), (−4, −4, 0), . . . , (4, 4, 4)}. Accordingly, in the first step STEP_1, the input of 27 DCA offsets to the memory device 1300 and the eye window size of the output data signal DQ will be measured. At this time, it may be assumed that the state of the DCA offset before the initial input of the DCA offset is (0, 0, 0), which is the default value of each of the internal clock signals QCLK, IBCLK, and QBCLK.

The eye window size for each of the 27 DCA offset combinations {(−4, −4, −4), (−4, −4, 0), . . . , (4, 4, 4)} may be calculated according to the result of the coarse DCA sweep in the first step STEP_1. The minimum value minEW among the eye windows of the four unit intervals (UI0, UI1, UI2, UI3) of the data signal DQ corresponding to each of the DCA offset combinations may be assigned as the score of each DCA offset combination. At this time, among the 27 DCA offset combinations, any one DCA offset combination with the maximum score may be selected as the improved or optimal DCA offset combination in the first step STEP_1.

If there is a tie among the scores minEW of 27 DCA offset combinations, the tie-break algorithm according to various example embodiments may be applied. For example, in the case of a tie, the DCA offset combination can be selected based on the sum of the even-eye window minimum value Even_minEW and the odd-eye window minimum value Odd_minEW in each output eye window. For example, in the case of tie, the DCA offset combination with a larger sum of the even-eye window minimum value Even_minEW and the odd-eye window minimum value Odd_minEW is selected as the improved or optimal DCA offset combination. The sum of the even-eye window minimum value Even_minEW and the odd-eye window minimum value Odd_minEW may or may not be a weighted sum; example embodiments are not limited thereto. The tie processing algorithm will be defined as a tie-break algorithm. Then, the host 1100 writes the determined optimal DCA offset combination as a DCA code into the memory device 1300 and completes the first step STEP_1 of hierarchical DCA training.

In the second step STEP_2, the host 1100 performs a first Fine1 DCA sweep with increased precision for each of the internal clock signals QCLK, IBCLK, and QBCLK based on the DCA code determined in the first step STEP_1. In some examples, the second step STEP_2 uses offsets '−2, 0, 2' that are more precise than the DCA offset values of the first step STEP_1. For example, for DCA sweep in the second step STEP_2, 27 offset combinations {(−2, −2, −2), (−2, −2, 0), . . . , (2, 2, 2)} is used. In the second step STEP_2, 27 DCA offset inputs to the memory device 1300 and the eye window size measurement of the output data signal DQ will be performed.

The eye window size for each of the 27 DCA offset combinations {(−2, −2, −2), (−2, −2, 0), . . . , (2, 2, 2)} will be calculated according to the result of the first fine Fine1 DCA sweep in the second step STEP_2. Furthermore the scores for the 27 DCA offset combinations are determined in the same way as in the first step STEP_1. At this time, if there is a tie among the scores of 27 DCA offset combinations, a tie-break algorithm may be applied. When the improved or optimal DCA offset combination is determined in the second step STEP_2, the host 1100 sets the memory device 1300 with the corresponding DCA code and completes the second step STEP_2 of hierarchical DCA training. The tie-break algorithm may be based on a weighted sum of minimum even and odd eye-windows, that may or may not use the same weights as used in the tie-break algorithm performed after the first step STEP_1; example embodiments are not limited thereto.

In the third step STEP_3, the host 1100 performs a second fine Fine2 DCA sweep for each of the internal clock signals QCLK, IBCLK, and QBCLK based on the DCA code determined in the second step STEP_2. That is, the third step STEP_3 uses offsets '−1, 0, 1' that are more precise than the offset values of the DCA code of the second step STEP_2. For the second fine Fine2 DCA sweep in the third step STEP_3, the 27 offset combinations {(−1, −1, −1), (−1, −1, 0), . . . , (1, 1, 1)} of each of the internal clock signals QCLK, IBCLK, and QBCLK are used.

The eye window size for each of the 27 DCA offset combinations {(−1, −1, −1), (−1, −1, 0), . . . , (1, 1, 1)} will be calculated according to the result of the second Fine2 DCA sweep in the third step STEP_3. The scores for the 27 DCA offset combinations are determined in the same way as in the first step STEP_1 or the second step STEP_2. When the improved or optimal DCA offset combination is determined in the third step STEP_3, the host 1100 sets the memory device 1300 with the corresponding DCA code and completes the third step STEP_3 of hierarchical DCA training.

Above, the characteristics of hierarchical DCA training were briefly explained. The adjustment precision of internal clock signals QCLK, IBCLK, and QBCLK can be increased by gradually reducing the DCA offset size in each of the three stages in a '4-2-1' manner. The number of times to write the DCA code for DCA sweep in each of the three steps is 27 offset combinations. Therefore, for three-stage hierarchical DCA training, 81 (=27+27+27) DCA sweeps are performed. If training is performed using all DCA code combinations rather than hierarchical DCA training, the DCA code combinations of the '15×15×15=3375' case must be tested or used. This indicates that DCA code combinations according to various example embodiments can be dramatically shortened. Alternatively or additionally, high accuracy DCA training may be possible using the tie-break algorithm of example embodiments.

Figure 5:
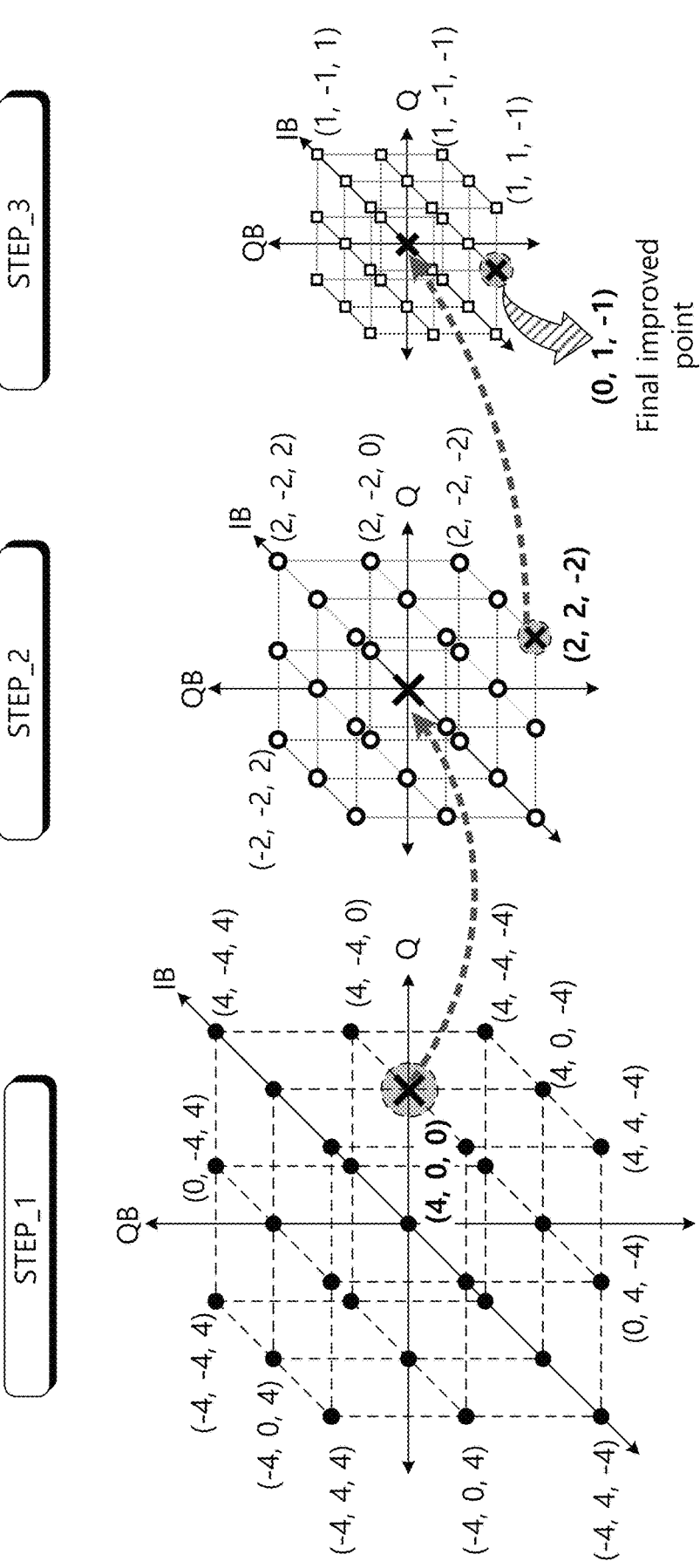
FIG. 5 is a diagram visually showing the DCA code combination for each step in the hierarchical DCA training of FIG. 4.

FIG. 5 is a diagram visually showing the DCA code combination for each step in the '4-2-1' hierarchical DCA training described in FIG. 4. Referring to FIG. 5, DCA offset combinations used in each of the three steps (STEP_1, STEP_2, and STEP_3) for hierarchical DCA training are arranged in the form of 3-dimensional coordinates.

The DCA offset values of each internal clock signals written for DCA sweep in the first step STEP_1 may be any one of '−4', '0', and '4'. In short, the DCA offset values of each of the internal clock signals QCLK, IBCLK, and QBCLK are mapped to any one of '−4', '0', and '4' on the three axes (Q, IB, QB). Accordingly, the offset combinations may each correspond to 27 coordinate points. To perform the first step STEP_1 of hierarchical DCA training, the host 1100 writes a DCA code corresponding to each of the 27 offset combinations and detects the data margin.

The eye window size of each 27 DCA offset combinations {(−4, −4, −4), (−4, −4, 0), . . . , (4, 4, 4)} according to the result of the coarse DCA sweep in the first step STEP_1 is detected. Furthermore the minimum value minEW of the eye window sizes of the four unit intervals UI0, UI1, UI2, and UI3 of the data signal DQ corresponding to each of the DCA offset combinations is calculated as the score of each DCA offset combination. At this time, among the 27 DCA offset combinations, the DCA offset combination with the maximum score may be selected as the improved or optimal offset combination in the first step STEP_1. If there is a tie among the scores (i.e., minEWs) of the 27 DCA offset combinations, a tie-break algorithm may be used. As shown, if (4, 0, 0) is selected as the improved or optimal DCA offset combination, the host 1100 will set the memory device 1300 with the corresponding DCA code.

The offset values of the DCA code written for DCA sweep in the second step STEP_2 can be any one of '−2', '0', and '2'. The offset values of each of the internal clock signals QCLK, IBCLK, and QBCLK can be mapped to any one of '−2', '0', and '2' on the three axes (Q, IB, QB). Offset combinations may correspond to 27 coordinate points with magnitudes of '−2', '2', or '0' in three-dimensional coordinates of three axes (Q, IB, QB).

The eye window size of each 27 offset combinations {(−2, −2, −2), (−2, −2, 0), . . . , (2, 2, 2)} according to the result of the first Fine1 DCA sweep applying the offset size '2' in the second step STEP_2 is calculated. Further the minimum value minEW of the eye windows of the four unit intervals UI0, UI1, UI2, and UI3 of the data signal DQ corresponding to each of the offset combinations is calculated as the score of each offset combination. At this time, among the 27 offset combinations, the DCA offset combination with the maximum score may be selected as the improved or optimal offset combination in the second step STEP_2. Additionally, if there is a tie among the scores (i.e., minEWs) of 27 DCA offset combinations, the improved or optimal offset combination can be selected using a tie-break algorithm. Let us assume that the improved or optimal offset combination is selected as (2, 2, −2). Then, the host 1100 writes the DCA codes corresponding to offset values '2', '2', and '−2' to the memory device 1300 to set the duty cycle of each of the internal clock signals QCLK, IBCLK, and QBCLK to complete the second step STEP_2.

In the third step STEP_3, any one of '−1', '0', and '1' can be written as the offset value of the DCA code for DCA sweep. In other words, the offset values of each of the internal clock signals QCLK, IBCLK, and QBCLK can be mapped to any one of '−1', '0', and '1' on the three axes (Q, IB, QB). Offset combinations may correspond to 27 coordinate points with magnitudes of '−1', '1', or '0' in three-dimensional coordinates of three axes (Q, IB, QB). Accordingly, the host 1100 will perform a DCA sweep corresponding to each of the 27 offset combinations to proceed with the third step STEP_3 of hierarchical DCA training.

The eye window size of each 27 offset combinations {(−1, −1, −1), (−1, −1, 0), . . . , (1, 1, 1)} according to the results of the second Fine2 DCA sweep applying the offset size '1' in the third step STEP_3 is calculated. Further the minimum value minEW of the eye windows of the four unit intervals UI0, UI1, UI2, and UI3 of the data signal DQ corresponding to each of the offset combinations is calculated as the score of each offset combination. At this time, among the 27 offset combinations, any one DCA offset combination with the maximum score may be selected as the improved or optimal offset combination in the second step STEP_2. Additionally, if there is a tie among the scores (i.e., minEWs) of 27 DCA offset combinations, the improved or optimal offset combination can be selected using the tie-break algorithm. Let us assume that the improved or optimal offset combination is selected as (0, 1, −1). Then, the host 1100 writes DCA code corresponding to offset values '0', '1', and '−1' to the memory device 1300 to complete the third step STEP_3. When the improved or optimal DCA code is determined through the DCA sweep of the third step STEP_3 and the setting of the memory device 1300 using the determined optimal DCA code is completed, the hierarchical DCA training of the present invention is completed.

Above, the gradual reduction procedure of DCA codes used in hierarchical DCA training was briefly described. By gradually reducing the offset size to '4-2-1' manner in each of the three stages, the adjustment precision of the duty cycle of the internal clock signals QCLK, IBCLK, and QBCLK can be increased.

Figure 6:
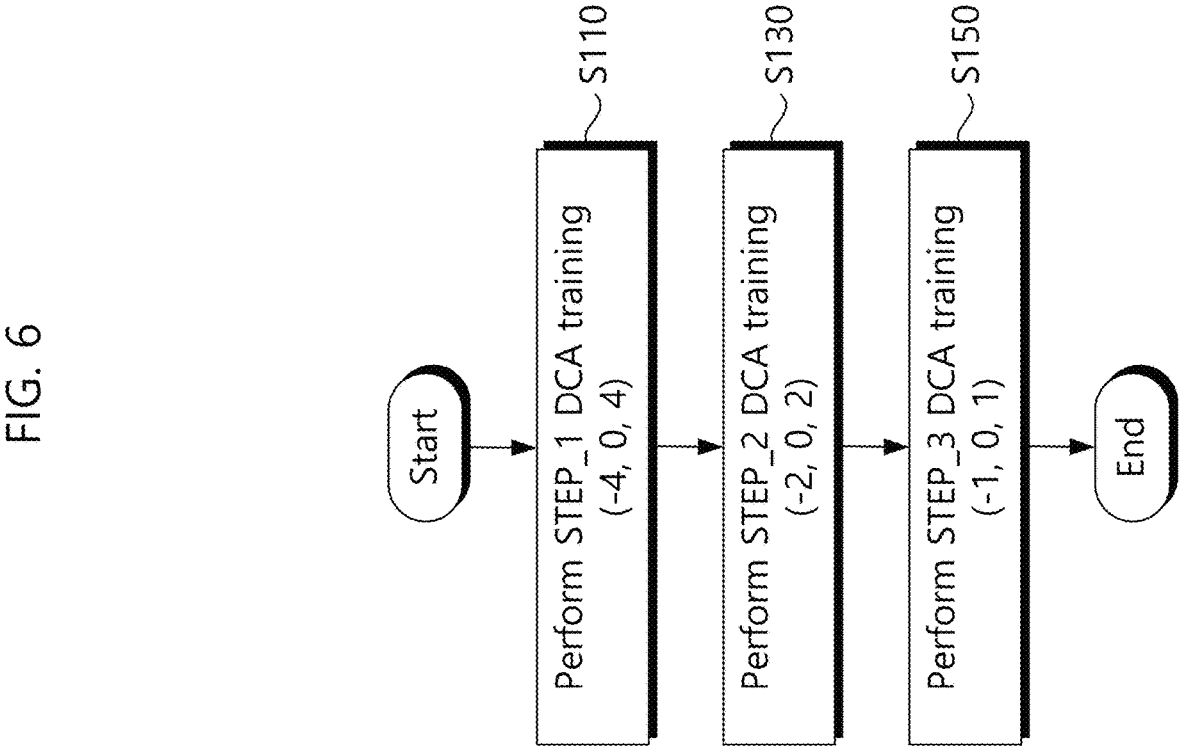
FIG. 6 is a flow chart briefly showing the hierarchical DCA training procedure according to various example embodiments.

FIG. 6 is a flow chart briefly showing the hierarchical DCA training procedure of the present invention. Referring to FIG. 6, the memory system 1000 (see FIG. 1) of the present invention sequentially performs hierarchical DCA training on internal clock signals QCLK, IBCLK, and QBCLK.

In operation S110, the host 1100 performs the first step STEP_1 of hierarchical DCA training. The host 1100 may set the DCA offset to any one of '−4', '0', and '4' for a coarse DCA sweep in the first step STEP_1. There can be 27 offset combinations of internal clock signals QCLK, IBCLK, and QBCLK. The host 1100 will perform a DCA sweep using the DCA code corresponding to each of the 27 offset combinations to proceed with the first step STEP_1 of hierarchical DCA training. The host 1100 generates a score from the eye window EW size for each of the 27 offset combinations. Additionally, if there is a tie among the scores of 27 DCA offset combinations, the host 1100 may select the improved or optimal offset combination using a tie-break algorithm. Once the improved or optimal offset combination is determined, the host 1100 writes the DCA code corresponding to the improved or optimal offset combination into the memory device 1300.

In operation S130, the host 1100 performs the second step STEP_2 of hierarchical DCA training. The host 1100 performs the second step STEP_2 of hierarchical DCA training based on the improved or optimal DCA code generated as a result of the first step STEP_1 set. For DCA sweep in the second step STEP_2, the host 1100 can set the DCA offset to any of '−2', '0', and '2'. The host 1100 will perform the DCA sweep using the DCA code corresponding to each of the 27 offset combinations to proceed with the second step STEP_2 of hierarchical DCA training. Further, as a result of the DCA sweep, the host 1100 calculates the eye window EW size for each of the 27 offset combinations. The host 1100 generates a score from the eye window EW size for each of the 27 offset combinations. The score generation method is the same as that applied to the first step STEP_1. Additionally, if there is a tie among the scores of 27 DCA offset combinations, the host 1100 may select the improved or optimal offset combination using the tie-break algorithm. Once the improved or optimal offset combination is determined, the host 1100 will write the DCA code corresponding to the selected optimal offset combination into the memory device 1300. Then, the duty cycle of each of the internal clock signals QCLK, IBCLK, and QBCLK in the second step STEP_2 is set to an optimal value.

In operation S150, the host 1100 performs the third step STEP_3 of hierarchical DCA training. The host 1100 performs the third step STEP_3 of hierarchical DCA training based on the improved or optimal DCA code generated as a result of the second step STEP_2 set. For DCA sweep in the third step STEP_3, the host 1100 can set the DCA offset to one of '−1', '0', and '1'. As a result of the DCA sweep, the host 1100 calculates the eye window EW size for each of the 27 offset combinations. The host 1100 generates a score from the eye window EW size for each of the 27 offset combinations. The score generation method is the same as that applied in the first step STEP_1 and the second step STEP_2. Additionally, if there is a tie among the scores of 27 DCA offset combinations, the host 1100 may select the improved or optimal offset combination using the tie-break algorithm. Once the improved or optimal offset combination is determined, the host 1100 will write the DCA code corresponding to the selected optimal offset combination into the memory device 1300. Then, the duty cycle of each of the internal clock signals QCLK, IBCLK, and QBCLK in the third step STEP_3 can be set to an optimal value.

Above, the hierarchical DCA training method for internal clock signals according to various example embodiments has been described. By gradually reducing the DCA offset size in three steps, such as '4-2-1', the adjustment precision of the duty cycle of the internal clock signals QCLK, IBCLK, and QBCLK can be increased. In addition, if the tie occurs among the scores at each step of hierarchical DCA training, high accuracy DCA code selection is possible using the tie-break algorithm of the present invention.

Figure 7:
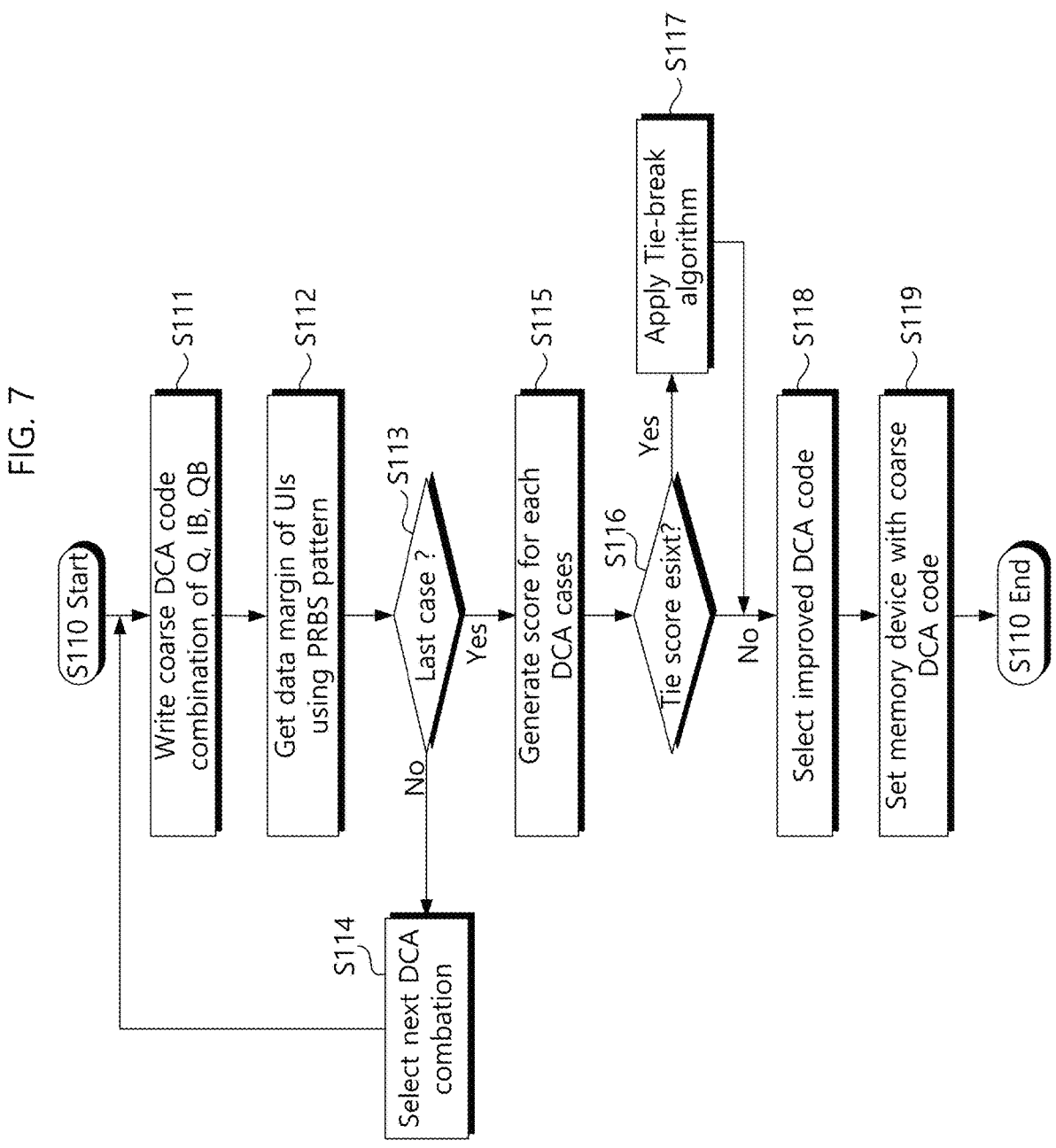
FIG. 7 is a flowchart showing operation S110 of FIG. 6 in more detail.

FIG. 7 is a flowchart showing operation S110 of FIG. 6 in more detail. Referring to FIG. 7, the host 1100 (see FIG. 1) performs a coarse DCA sweep to perform the first step STEP_1 of hierarchical DCA training and determines an optimal DCA code.

In operation S111, the host 1100 writes a DCA code corresponding to one of 27 offset combinations of internal clock signals QCLK, IBCLK, and QBCLK to the memory device 1300 for DCA sweep. Here, the host 1100 uses relatively large offsets (e.g., '−4', '0', and '4') to determine the duty cycle of the internal clock signals QCLK, IBCLK, and QBCLK.

In operation S112, the duty cycle of the internal clock signals QCLK, IBCLK, and QBCLK of the memory device 1300 (see FIG. 1) will be adjusted according to the DCA code written in operation S111. Then, the size of the eye window EW of the data signal DQ is adjusted according to the duty cycle of the adjusted internal clock signals QCLK, IBCLK, and QBCLK. As a result, the memory device 1300 will output a data pattern corresponding to the DCA code written in operation S111 through the data signal DQ. At this time, the data pattern used may be, for example, a random sequence such as a pseudo-random binary sequence PRBS. Then, the host 1100 can measure the data margin or eye window size of the output data pattern.

In operation S113, the method may determine whether the DCA code combination applied in operations S111 and S112 is the last combination (or case) among all combinations. When all DCA sweeps for each of the 27 DCA code combinations are completed, the procedure will move to operation S115. On the other hand, if there is a combination that is not used in the DCA sweep among the 27 DCA code combinations, the procedure moves to operation S114.

In operation S114, the host 1100 selects a DCA offset combination that was not applied in the DCA sweep of the first step STEP_1. Afterwards, the procedure moves to operation S111, where a DCA sweep using the selected DCA offset combination will be performed.

In operation S115, the host 1100 calculates a score using the output pattern or eye window of the data signal DQ corresponding to the 27 DCA code combinations. For example, the minimum value minEW among the eye windows of the four unit intervals (UI0, UI1, UI2, and UI3) of the data signal DQ may be calculated as the score of each offset combination.

In operation S116, the host 1100 determines whether a tie exists among the scores of each offset combination. For example, scores of the same value may exist among the scores of each offset combination. If there is no tie score, the procedure moves to operation S118. On the other hand, if there are scores of the same value among the scores of each offset combination, the procedure moves to operation S117.

In operation S117, if there is a tie among the scores of the DCA offset combinations, the host 1100 selects the improved or optimal offset combination using a tie-break algorithm. That is, the DCA offset combination with the largest sum of the even-eye window minimum value Even_minEW and the odd-eye window minimum value Odd_minEW of each tie case can be selected as the improved or optimal DCA offset combination.

In operation S118, the host 1100 may select the DCA offset combination with the maximum score as the improved or optimal DCA offset combination. Alternatively, if there is a tie score, the DCA offset combination selected using a tie-break algorithm may be selected as the improved or optimal DCA offset combination.

In operation S119, the host 1100 will write the DCA code corresponding to the determined optimal offset combination into the memory device 1300. Then, the first step STEP_1 of hierarchical DCA training is completed.

Above, the coarse DCA sweep process for performing first step STEP_1 of hierarchical DCA training was briefly described. By the coarse DCA sweep, the duty cycle of the internal clock signals QCLK, IBCLK, and QBCLK of the memory device 1300 is improved or optimized over a large offset value ranges (e.g., '−4', '0', and '4').

FIG. 8 is a table explaining a tie-breaking algorithm corresponding to the tie-breaking technology of the present invention. Referring to FIG. 8, the host 1100 performs a DCA sweep on the memory device 1300 and calculates a score for each of 27 DCA code combinations. Further when a tie situation occurs, the host 1100 calculates Sum(Even/Odd), which is the sum of the even-eye window minimum value Even_minEW and the odd-eye window minimum value Odd_minEW. Further the DCA offset combination with the largest Sum(Even/Odd) is selected as the improved or optimal offset combination. Although example embodiments describe calculating a sum of the even and odd eye-windows, example embodiments are not limited thereto. For example, in some examples an average and/or a product and/or a geometric mean and/or a harmonic mean of the even and odd eye-windows may be calculated, and/or another function of the even and odd eye-windows may be calculated, for the tie-break algorithm.

First, for each DCA code combination, the minimum value minEW among the eye windows of the four unit intervals UI0, UI1, UI2, and UI3 of the data signal DQ is calculated as the score. For example, the minimum eye window value minEW of the DCA code combination (−4, 0, 4) corresponding to the DCA index '5' will be detected as '35'. In this way, the host 1100 calculates scores for 27 DCA offset combinations. Next, the host 1100 will select the DCA code combination corresponding to the maximum value among the 27 scores as the improved or optimal offset combination. However, as shown, two cases (A, B) are detected with the same score of '40'. Therefore, a tie-breaking algorithm must be applied to handle ties.

To process a tie, the host 1100 may add the even-eye window minimum value Even_minEW and the odd-eye window minimum value Odd_minEW, e.g., for each tie case. The minimum even-eye window Even_minEW and minimum odd-eye window Odd_minEW in the DCA code combination of DCA index '13' are detected as 40 and 41, respectively. On the other hand, the minimum even-eye window Even_minEW and minimum odd-eye window Odd_minEW in the DCA code combination of DCA index '22' are detected as 40 and 43, respectively. Therefore, 'Sum(Even/Odd)', which is the sum of the even-eye window minimum value Even_minEW and the odd-eye window minimum value Odd_minEW, appears as '81' and '83', respectively. Therefore, the B-case with larger 'Sum(Even/Odd)' may be selected as the improved or optimal offset combination.

Figure 9:
FIG. 9 is a flowchart showing operation S130 of FIG. 6 in more detail.

FIG. 9 is a flowchart showing operation S130 of FIG. 6 in more detail. Referring to FIG. 9, the host 1100 (see FIG. 1) performs a DCA sweep to perform the second step STEP_2 of hierarchical DCA training and determines an optimal DCA offset.

In operation S131, the host 1100 writes a DCA code corresponding to one of 27 offset combinations of internal clock signals QCLK, IBCLK, and QBCLK to the memory device 1300 for the first fine DCA sweep. Here, the host 1100 uses offset values (e.g., '−2', '0', and '2') smaller than the offset size in the first step STEP_1 to set the duty cycle of the internal clock signals QCLK, IBCLK, and QBCLK.

In operation S132, the duty cycle of the internal clock signals QCLK, IBCLK, and QBCLK of the memory device 1300 will be adjusted according to the DCA code written in operation S131. The memory device 1300 will output a data pattern corresponding to the DCA code written in operation S131 through the data signal DQ. Then, the host 1100 can measure the data margin or eye window size of the output data pattern.

In operation S133, it is determined whether the DCA offset combination applied in operations S131 and S132 is the last combination (or case) among all combinations. When all DCA sweeps for each of the 27 DCA code combinations are completed, the procedure will move to operation S135. On the other hand, if there is a combination that is not used in the DCA sweep among the 27 DCA code combinations, the procedure moves to operation S134.

In operation S134, the host 1100 selects a DCA code combination that was not applied in the DCA sweep of the second step STEP_2. Afterwards, the procedure moves to operation S131, where a DCA sweep using the selected DCA code combination will be performed.

In operation S135, the host 1100 calculates a score using the output pattern or eye window size of the data signal DQ corresponding to the 27 DCA code combinations. For example, the minimum value minEW among the eye windows of the four unit intervals UI0, UI1, UI2, and UI3 of the data signal DQ may be calculated as the score of each offset combination.

In operation S136, the host 1100 determines whether a tie exists among the scores of each offset combination. For example, scores of the same value may exist among the scores of each offset combination. If there is no tie score, the procedure moves to operation S138. On the other hand, if there are scores of the same value among the scores of each offset combination, the procedure moves to operation S137.

In operation S137, if there is the tie among the scores of the DCA offset combinations, the host 1100 selects the improved or optimal offset combination using a tie-break algorithm.

In operation S138, the host 1100 may select the DCA offset combination with the maximum score corresponding to each of the generated DCA offset combinations as the improved or optimal DCA offset combination. Alternatively, if a tie occurs, the host 1100 may select the selected DCA offset combination as the improved or optimal DCA offset combination using the tie-break algorithm.

In operation S139, the host 1100 will write the DCA code corresponding to the determined optimal offset combination into the memory device 1300. Then, the second step STEP_2 of hierarchical DCA training is completed.

In the above, the first fine DCA sweep performed in the second step STEP_2 of hierarchical DCA training was briefly described.

Figure 10:
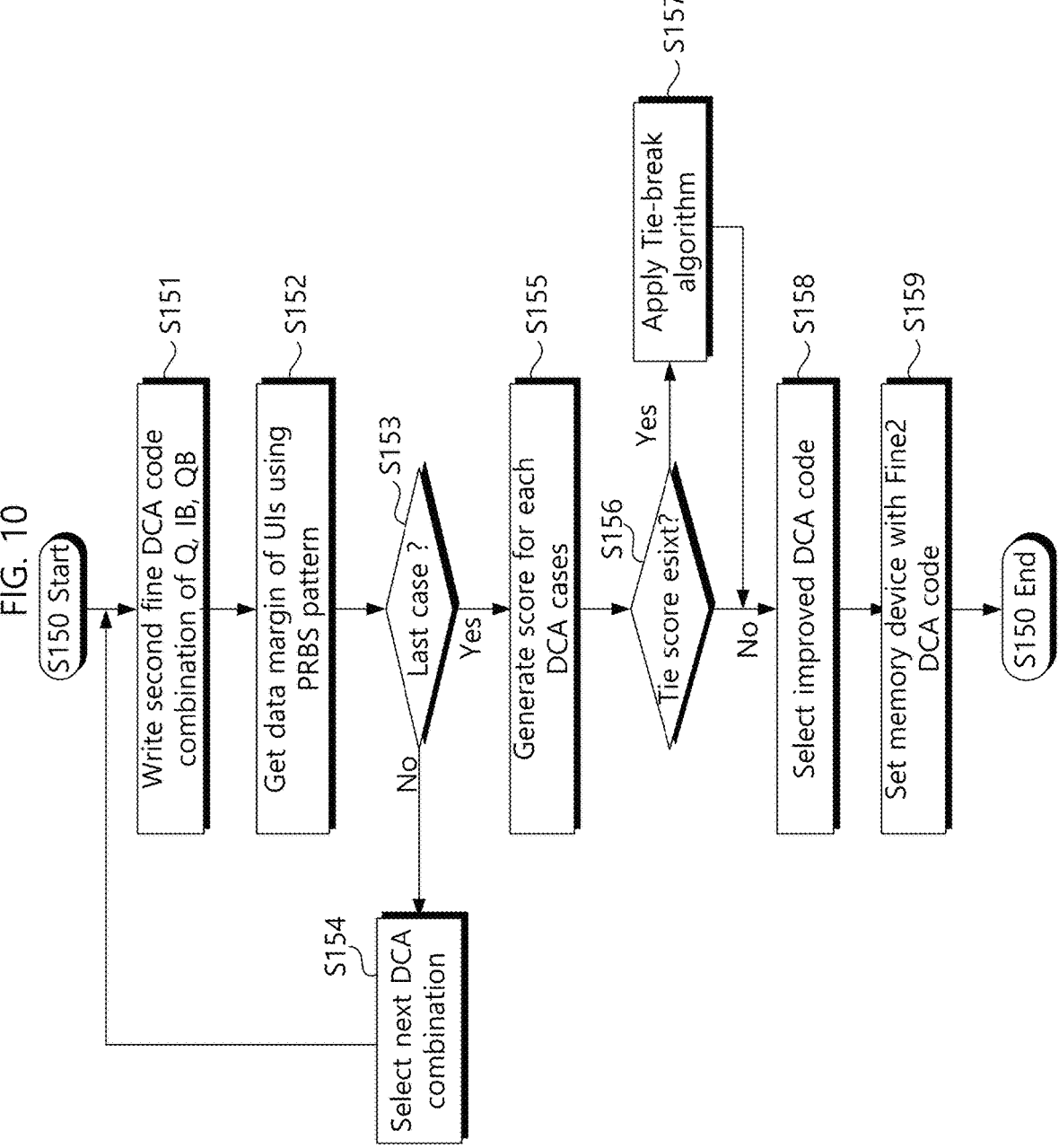
FIG. 10 is a flowchart showing operation S150 of FIG. 6 in more detail.

FIG. 10 is a flowchart showing operation S150 of FIG. 6 in more detail. Referring to FIG. 10, the host 1100 (see FIG. 1) performs a DCA sweep to perform the third step STEP_3 of hierarchical DCA training and determines an optimal DCA offset.

In operation S151, the host 1100 writes a DCA code corresponding to one of 27 offset combinations of internal clock signals QCLK, IBCLK, and QBCLK to the memory device 1300 for a second fine DCA sweep. Here, the host 1100 uses offset values (e.g., '–1', '0', and '1') smaller than the offset size in the second step STEP_2 to set the duty cycle of internal clock signals QCLK, IBCLK, and QBCLK.

In operation S152, the memory device 1300 (see FIG. 1) will adjust the duty cycle of the internal clock signals QCLK, IBCLK, and QBCLK according to the DCA code written in operation S151. The memory device 1300 will output a data pattern corresponding to the DCA code written in operation S151 through the data signal DQ. Then, the host 1100 can measure the data margin or eye window size of the output data pattern.

In operation S153, it is determined whether the DCA code combination applied in operations S151 and S152 is the last combination (or case) among all combinations. When all DCA sweeps for each of the 27 DCA code combinations are completed, the procedure will move to operation S155. On the other hand, if there is a combination that is not used in the DCA sweep among the 27 DCA code combinations, the procedure moves to operation S154.

In operation S154, the host 1100 selects a DCA offset combination that was not applied in the second fine DCA sweep of the third step STEP_3. Afterwards, the procedure moves to operation S151, where a DCA sweep using the selected DCA offset combination will be performed.

In operation S155, the host 1100 calculates a score using the output pattern or eye window of the data signal DQ corresponding to the 27 DCA code combinations.

In operation S156, the host 1100 determines whether a tie exists among the scores of each offset combination. If there is no tie score, the procedure moves to operation S158. On the other hand, if there are scores of the same value among the scores of each offset combination, the procedure moves to operation S157.

In operation S157, the host 1100 selects the improved or optimal offset combination using a tie-break algorithm. That is, the DCA offset combination with the largest sum of the minimum value of the even-eye pattern Even_minEW and the minimum value of the odd-eye pattern Odd_minEW in each of the tied cases can be selected as the improved or optimal DCA offset combination.

In operation S158, the host 1100 may select the DCA offset combination with the maximum score corresponding to each of the generated DCA offset combinations as the improved or optimal DCA offset combination. Alternatively, if a tie occurs, the host 1100 may select the selected DCA offset combination as the improved or optimal DCA offset combination using the tie-break algorithm.

In operation S159, the host 1100 will write a DCA code corresponding to the determined optimal offset combination into the memory device 1300. Then, the third step STEP_3 of hierarchical DCA training is completed.

In the above, the second fine DCA sweep process corresponding to the third step STEP_3 of hierarchical DCA training was briefly described. By DCA sweep, the duty cycle of the internal clock signals QCLK, IBCLK, and QBCLK of the memory device 1300 is improved or optimized to a range of small offset values (e.g., '–1', '0', and '1').

Figure 11:
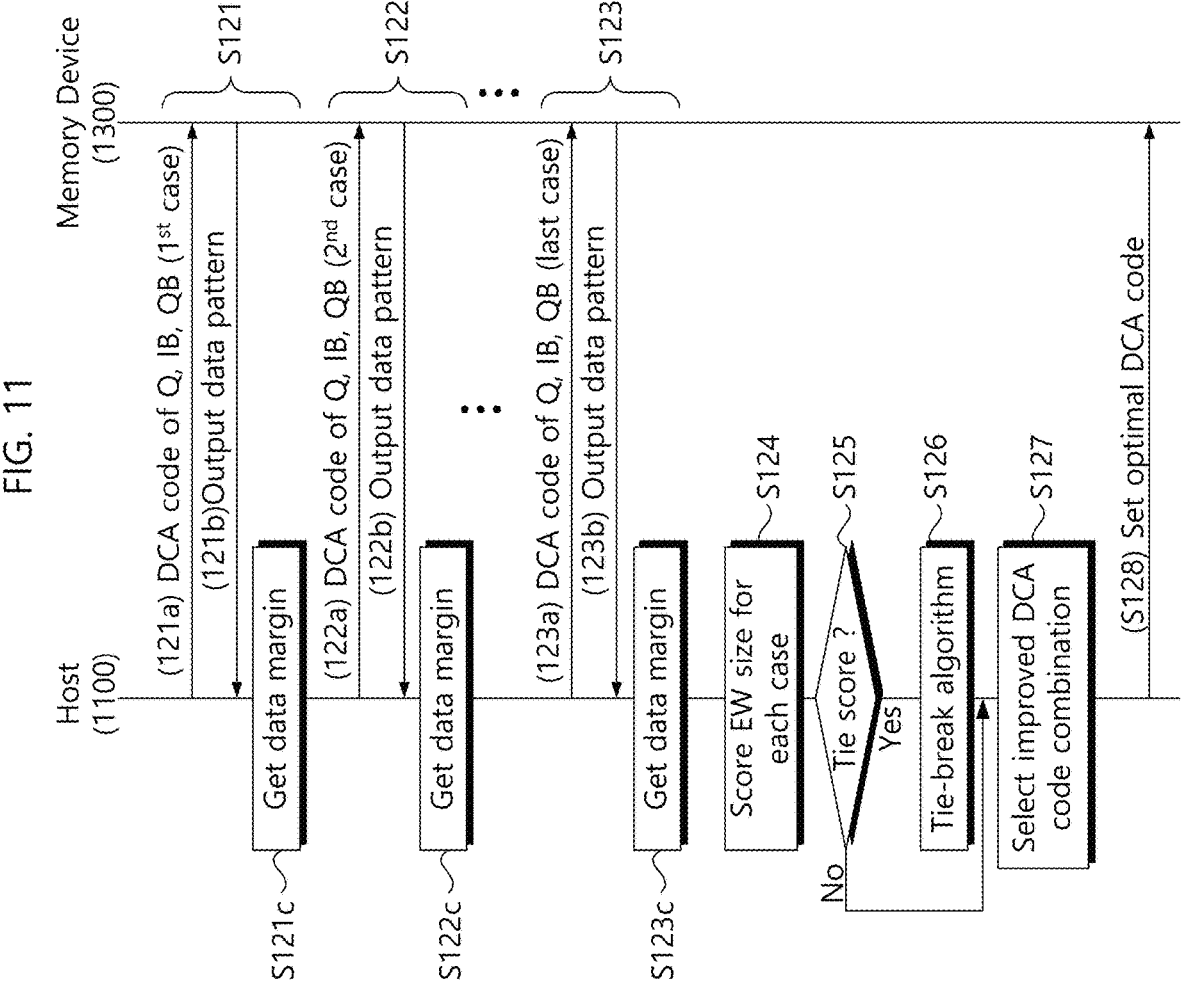
FIG. 11 is a diagram showing the mutual operation of a host and a memory device in the first step of hierarchical DCA training.

FIG. 11 is a diagram showing the mutual operation of a host and a memory device in the first step STEP_1 of hierarchical DCA training. Referring to FIG. 11, the host 1100 (see FIG. 1) performs a coarse DCA sweep to perform the first step STEP_1 of hierarchical DCA training and determines an optimal DCA code.

In operation S121, the host 1100 performs the DCA sweep on the memory device 1300 using a DCA code corresponding to one of the coarse offset combinations. For this purpose, the host 1100 writes a DCA code corresponding to one of the offset combinations of the internal clock signals QCLK, IBCLK, and QBCLK into the memory device 1300 in operation S121*a*. At this time, the DCA code combination written to the memory device 1300 consists of at least one of, for example, '–4', '0', and '4'. And in operation S121*b*, the host 1100 receives a data pattern from the memory device 1300. Next, in operation S121*c*, the host 1100 can measure the eye window size using the data pattern output from the memory device 1300.

Through operations S122 and S123, the host 1100 performs the DCA sweep using 27 DCA offset combinations. The procedures of operations S122 and S123 are substantially the same as operation S121, with only the DCA code combination being different. In operations S121 to S123, the host 1100 performs a DCA sweep for all 27 DCA code combinations and measures the window size for each case.

In operation S124, the host 1100 calculates a score corresponding to each of the 27 DCA code combinations from the data pattern output from the memory device 1300. For example, the minimum value minEW among the eye windows of the four unit intervals UI0, UI1, UI2, and UI3 of the data signal DQ may be calculated as the score of each offset combination.

In operation S125, the host 1100 determines whether a tie exists among the scores of each DCA code combination. If there is no tie score, the procedure moves to operation S127. On the other hand, if there are scores of the same value among the scores, the procedure moves to operation S126.

In operation S126, the host 1100 selects the improved or optimal offset combination using a tie-break algorithm.

In operation S127, the host 1100 may select the DCA code combination with the maximum score corresponding to each of the DCA offset combinations as the improved or optimal DCA offset combination. Alternatively, if a tie occurs, the host 1100 may select the selected DCA offset combination as the improved or optimal DCA offset combination using the tie-break algorithm.

In operation S128, the host 1100 will write the DCA code corresponding to the determined optimal offset combination into the memory device 1300. Then, the first step STEP_1 of hierarchical DCA training is completed.

Above, the coarse DCA sweep process for performing the first step STEP_1 of hierarchical DCA training was briefly described. By the coarse DCA sweep, the duty cycle of the internal clock signals QCLK, IBCLK, and QBCLK of the memory device 1300 is improved or optimized to large offset values (e.g., '−4', '0', and '4'). The second step STEP_2 and the third step STEP_3 of hierarchical DCA training will be executed by the same procedure except that the offset size is different.

Figure 12:
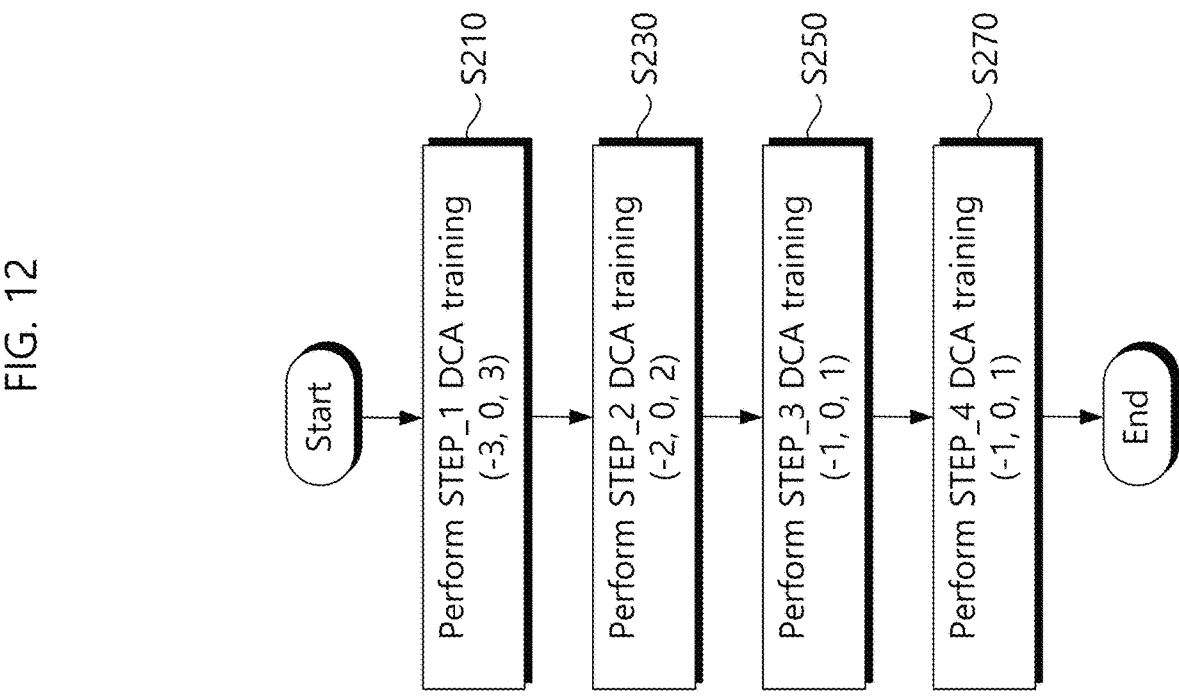
FIG. 12 is a flowchart briefly showing a hierarchical DCA training procedure according to various example embodiments.

FIG. 12 is a flowchart briefly showing a hierarchical DCA training procedure according to another embodiment of the present invention. Referring to FIG. 12, the memory system 1000 (see FIG. 1) of the present invention can perform four-step, '3-2-1-1' hierarchical DCA training on internal clock signals QCLK, IBCLK, and QBCLK.

In operation S210, the host 1100 performs the first step STEP_1 of hierarchical DCA training. The host 1100 may set the DCA offset values to one of '−3', '0', and '3' for DCA sweep in the first step STEP_1. Accordingly, 27 offset combinations of the internal clock signals QCLK, IBCLK, and QBCLK can be formed. The host 1100 will perform a DCA sweep using the DCA code corresponding to each of the 27 offset combinations to proceed with the first step STEP_1. And as a result of the DCA sweep, the host 1100 calculates the eye window EW size for each of the 27 offset combinations. Host 1100 generates a score from the eye window EW size for each of the 27 offset combinations. And among the 27 offset combinations, the DCA offset combination with the maximum score is selected as the improved or optimal offset combination in the first step STEP_1. Additionally, if there is a tie among the scores (i.e., minEW) of 27 DCA offset combinations, the host 1100 may select the improved or optimal offset combination using a tie-break algorithm. Once the improved or optimal offset combination is determined, the host 1100 will write a DCA code corresponding to the improved or optimal offset combination into the memory device 1300.

In operation S230, the host 1100 performs the second step STEP_2 of hierarchical DCA training. The host 1100 performs the second step STEP_2 of hierarchical DCA training with the improved or optimal DCA code generated as a result of the first step STEP_1 set. For DCA sweep in the second step STEP_2, the host 1100 can set the offset of the DCA code to one of '−2', '0', and '2'. The host 1100 will perform a DCA sweep using the DCA code corresponding to each of the 27 offset combinations to proceed with the second step STEP_2 of hierarchical DCA training. The host 1100 generates a score from the eye window EW size for each of the 27 offset combinations. The score generation method is the same as that applied to the first step STEP_1. Additionally, if there is a tie among the scores of 27 DCA offset combinations, the host 1100 may select the improved or optimal offset combination using the tie-break algorithm. Once the improved or optimal offset combination is determined, the host 1100 will write a DCA code corresponding to the selected optimal offset combination into the memory device 1300.

In operation S250, the host 1100 performs the third step STEP_3 of hierarchical DCA training. The host 1100 proceeds with the third step STEP_3 with the improved or optimal DCA code generated as a result of the second step STEP_2 set. For DCA sweep in the third step STEP_3, the host 1100 can set the offset of the DCA code to one of '−1', '0', and '1'. The host 1100 will perform a DCA sweep using the DCA code corresponding to each of the 27 offset combinations to proceed with the third step STEP_3 of hierarchical DCA training. The host 1100 generates a score from the eye window EW size for each of the 27 offset combinations. The score generation method is the same as that applied in the first step STEP_1 or the second step STEP_2. Additionally or alternatively, if there is a tie among the scores of 27 DCA offset combinations, the host 1100 may select the improved or optimal offset combination using the tie-break algorithm. Once the improved or optimal offset combination is determined, the host 1100 will write a DCA code corresponding to the selected optimal offset combination into the memory device 1300. Then, the duty cycle of each of the internal clock signals QCLK, IBCLK, and QBCLK in the third step STEP_3 can be set to an optimal value.

In operation sS270, the host 1100 performs the fourth step STEP_4 of hierarchical DCA training. The host 1100 proceeds with the fourth step STEP_4 with the improved or optimal DCA code generated as a result of the third step STEP_3 set. In the fourth step STEP_4, like the third step STEP_3, the offsets of the DCA code are '−1', '0', and '1'. The host 1100 will perform the DCA sweep using the DCA code corresponding to each of the 27 offset combinations to proceed with the fourth step STEP_4 of hierarchical DCA training. And as a result of the DCA sweep, the host 1100 calculates the eye window EW size for each of the 27 offset combinations. The host 1100 generates a score from the eye window EW size for each of the 27 offset combinations. The score generation method is the same as that applied in the first step STEP_1, the second step STEP_2, or the third step STEP_3. Additionally, if there is a tie among the scores of 27 DCA offset combinations, the host 1100 may select the improved or optimal offset combination using the tie-break algorithm. Once the improved or optimal offset combination is determined, the host 1100 will write the DCA code corresponding to the selected optimal offset combination into the memory device 1300. Then, the duty cycle of each of the internal clock signals QCLK, IBCLK, and QBCLK in the fourth step STEP_4 can be set to an optimal value.

Above, the hierarchical DCA training method for internal clock signals according to various example embodiments has been described. By gradually reducing the offset size to '3-2-1-1' in each of the four steps, the adjustment precision of the duty cycle of the internal clock signals QCLK, IBCLK, and QBCLK can be increased. alternatively or additionally, if a tie occurs among the scores at each step of hierarchical DCA training, high accuracy DCA code selection is possible using the tie-break algorithm of the present invention.

Figure 13:
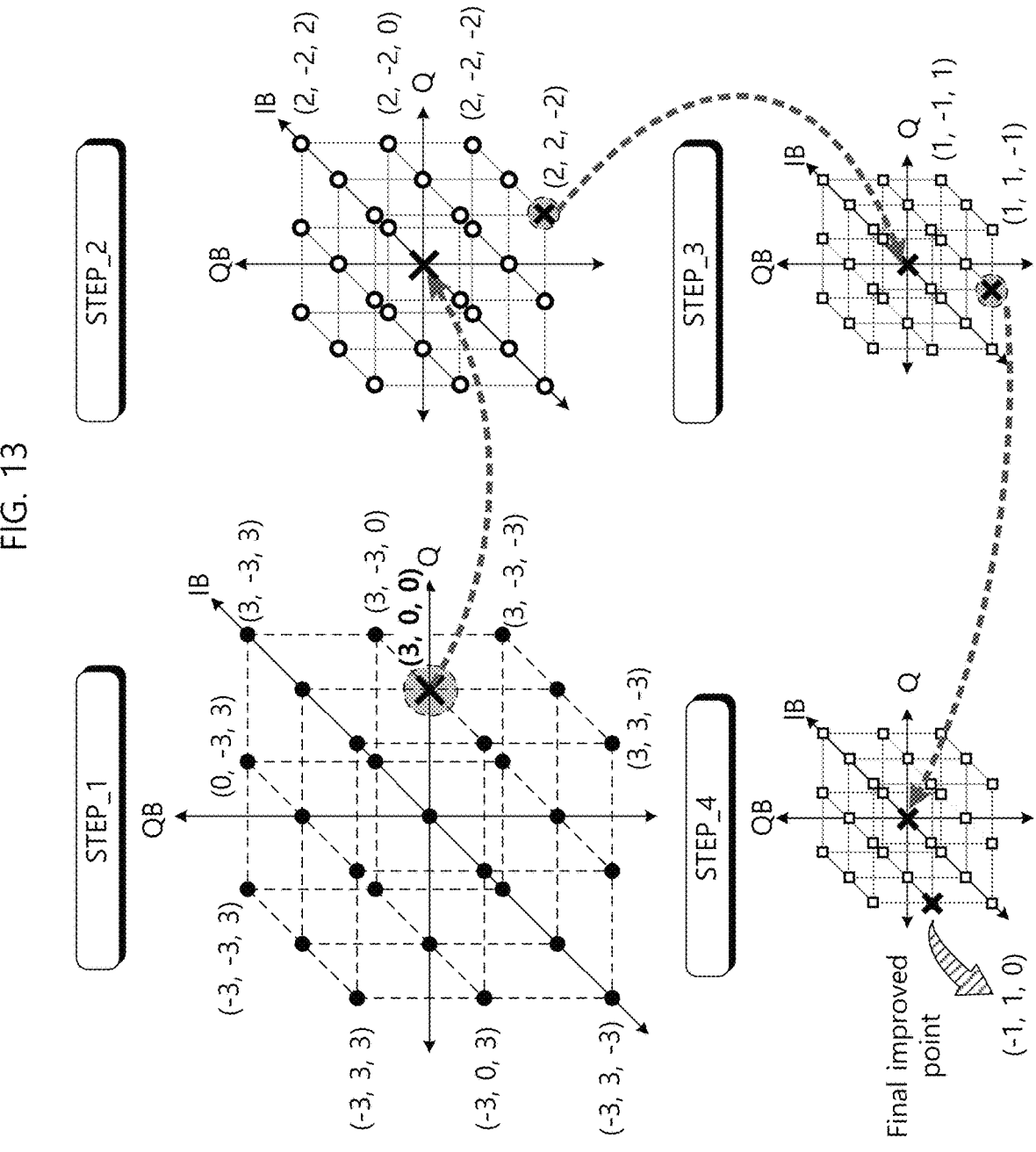
FIG. 13 is a diagram visually showing the DCA offset combination for each step in the '3-2-1-1' hierarchical DCA training described in FIG. 12.

FIG. 13 is a diagram visually showing the DCA offset combination for each step in the '3-2-1-1' hierarchical DCA training described in FIG. 12. Referring to FIG. 13, DCA offset combinations used in each of the four steps (STEP_1, STEP_2, STEP_3, and STEP_4) for hierarchical DCA training are shown in the form of 3D coordinates.

The offset values of the DCA code written for the DCA sweep in the first step STEP_1 may be any one of '−3', '0', and '3'. That is, the offset values of each of the internal clock signals QCLK, IBCLK, and QBCLK are mapped to any one of '−3', '0', and '3' on the three axes (Q, IB, QB). In short, offset combinations may correspond to 27 coordinate points. Accordingly, the host 1100 will perform a DCA sweep using each of the 27 offset combinations to proceed with the first step STEP_1 of hierarchical DCA training.

The eye window size for each 27 offset combinations {(−3, −3, −3), (−3, −3, 0), . . . , (3, 3, 3)} is calculated according to the result of the DCA sweep applying the offset size '3' in the first step STEP_1. And the minimum value minEW of the eye windows of the four unit intervals UI0, UI1, UI2, and UI3 of the data signal DQ corresponding to each of the offset combinations is calculated as the score of each offset combination. At this time, among the 27 offset combinations, any one DCA offset combination with the maximum score may be selected as the improved or optimal offset combination in the first step STEP_1. Additionally, if there is a tie among the scores of 27 DCA offset combinations, the improved or optimal offset combination can be selected using a tie-break algorithm. For example, assume that (3, 0, 0) is selected as the improved or optimal offset combination. Then, the host 1100 writes the memory device 1300 with DCA codes corresponding to offsets '3', '0', and '0' to set the duty cycle of each of the internal clock signals QCLK, IBCLK, and QBCLK.

The DCA offset written for the DCA sweep in the second step STEP_2 may be any one of '−2', '0', and '2'. That is, the offset values of each of the internal clock signals QCLK, IBCLK, and QBCLK can be mapped to any one of '−2', '0', and '2' on the three axes (Q, IB, QB). Offset combinations may correspond to 27 coordinate points with magnitudes of '−2', '2', or '0' in three-dimensional coordinates of three axes (Q, IB, QB). Accordingly, the host 1100 will perform a DCA sweep corresponding to each of the 27 offset combinations to proceed with the second step STEP_2 of hierarchical DCA training.

The eye window size for each 27 offset combinations $\{(-2, -2, -2), (-2, -2, 0), \ldots, (2, 2, 2)\}$ is calculated according to the result of the DCA sweep applying the offset size '2' in the first step STEP_2. And the minimum value minEW of the eye windows of the four unit intervals UI0, UI1, UI2, and UI3 of the data signal DQ corresponding to each of the offset combinations is calculated as the score of each offset combination. For example, assume the improved or optimal offset combination is selected as (2, 2, −2). Then, the host 1100 sends DCA codes corresponding to offsets '2', '2', and '−2' to the memory device 1300 to set the duty cycle of each of the internal clock signals QCLK, IBCLK, and QBCLK to complete the second step STEP_2.

In the third step STEP_3, any one of '−1', '0', and '1' can be written as the offset value of the DCA code for DCA sweep. That is, the offset of each of the internal clock signals QCLK, IBCLK, and QBCLK can be mapped to any one of '−1', '0', and '1' on the three axes (Q, IB, QB). Offset combinations may correspond to 27 coordinate points with magnitudes of '−1', '1', or '0' in three-dimensional coordinates of three axes (Q, IB, QB). Accordingly, the host 1100 will perform a DCA sweep corresponding to each of the 27 offset combinations to proceed with the third step STEP_3 of hierarchical DCA training.

The eye window size for each 27 offset combinations $\{(-1, -1, -1), (-1, -1, 0), \ldots, (1, 1, 1)\}$ is calculated according to the result of the DCA sweep applying the offset size '1' in the first step STEP_3. And the minimum value minEW of the eye windows of the four unit intervals UI0, UI1, UI2, and UI3 of the data signal DQ corresponding to each of the offset combinations is calculated as the score of each offset combination. At this time, among the 27 offset combinations, any one DCA offset combination with the maximum score may be selected as the improved or optimal offset combination in the second step STEP_2. Additionally, if there is a tie among the scores of 27 DCA offset combinations, the improved or optimal offset combination can be selected using the tie-break algorithm. For example, assume that the improved or optimal offset combination is selected as (0, 1, −1). Then, the host 1100 writes DCA codes corresponding to offset values '0', '1', and '−1' to the memory device 1300 to complete the third step STEP_3.

In the fourth step STEP_4, DCA sweep is performed again using the same offset size as the third step STEP_3. The fourth step STEP_4 can be said to be a DCA sweep operation that is substantially the same as the third step STEP_3, except that the memory device 1300 is set to the DCA code determined in the third step STEP_3. It is assumed that the improved or optimal offset combination (−1, 1, 0) is selected as a result of the DCA sweep. Then, the host 1100 sends DCA codes corresponding to offset values '−1', '1', and '0' to the memory device 1300 to complete the fourth step STEP_4. When the improved or optimal DCA code is determined through the DCA sweep of the fourth step STEP_4 and the setting of the memory device 1300 using the determined optimal DCA code is completed, the hierarchical DCA training of the present invention is completed.

Above, the gradual reduction procedure of DCA codes used in hierarchical DCA training was briefly described. By reducing the offset size in each of the four stages in a '3-2-1-1' manner, the adjustment precision of the duty cycle of the internal clock signals QCLK, IBCLK, and QBCLK can be increased. In addition, if the tie occurs among the scores at each step of hierarchical DCA training, high accuracy DCA code selection is possible using the tie-break algorithm of the present invention.

Figure 14:
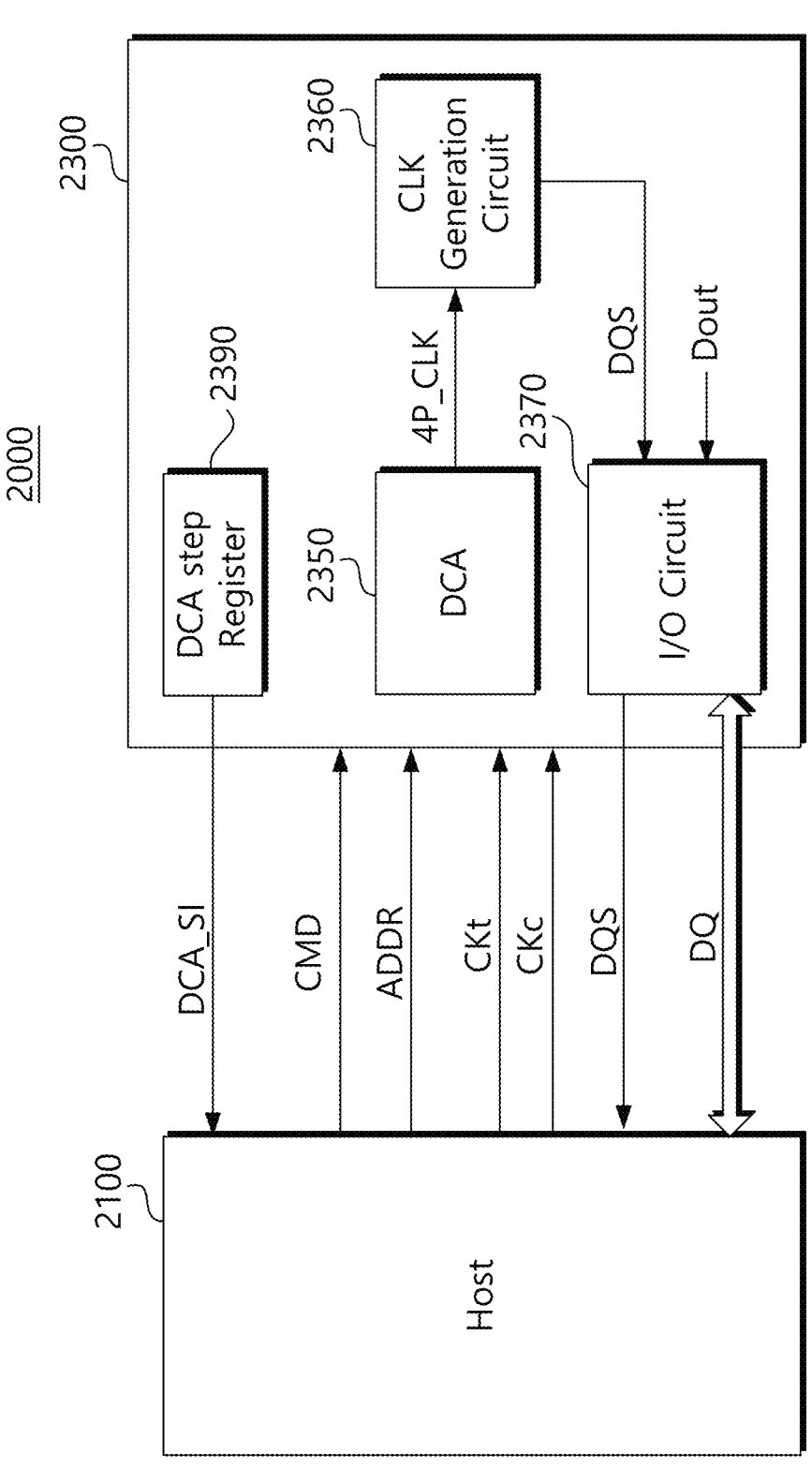
FIG. 14 is a block diagram showing a memory system according to various example embodiments.

FIG. 14 is a block diagram showing a memory system according to another embodiment of the present invention. Referring to FIG. 14, the memory system 2000 includes a host 2100 and a memory device 2300. The host 2100 performs DCA training with reference to the DCA step information DCA_SI provided by the memory device 2300.

The host 2100 reads DCA step information DCA_SI from the DCA step register 2390 of the memory device 2300 before performing DCA training. DCA step information DCA_SI may include information on whether to proceed with the hierarchical DCA training method in the '4-2-1' manner or the '3-2-1-1' manner. Alternatively, the DCA step information DCA_SI may store the final DCA code obtained as a result of hierarchical DCA training performed in the test phase in the memory device 2300. In this case, the host 2100 can write the final DCA code to the memory device 2300 without separate DCA training.

The memory device 2300 may include a duty cycle adjuster 2350, a clock generator 2360, an input/output circuit 2370, and a DCA step register 2390. Memory device 2300 is substantially the same as memory device 1300 of FIG. 1 except that it includes a DCA step register 2390. Therefore, detailed description of the memory device 2300 will be omitted.

Figure 15:
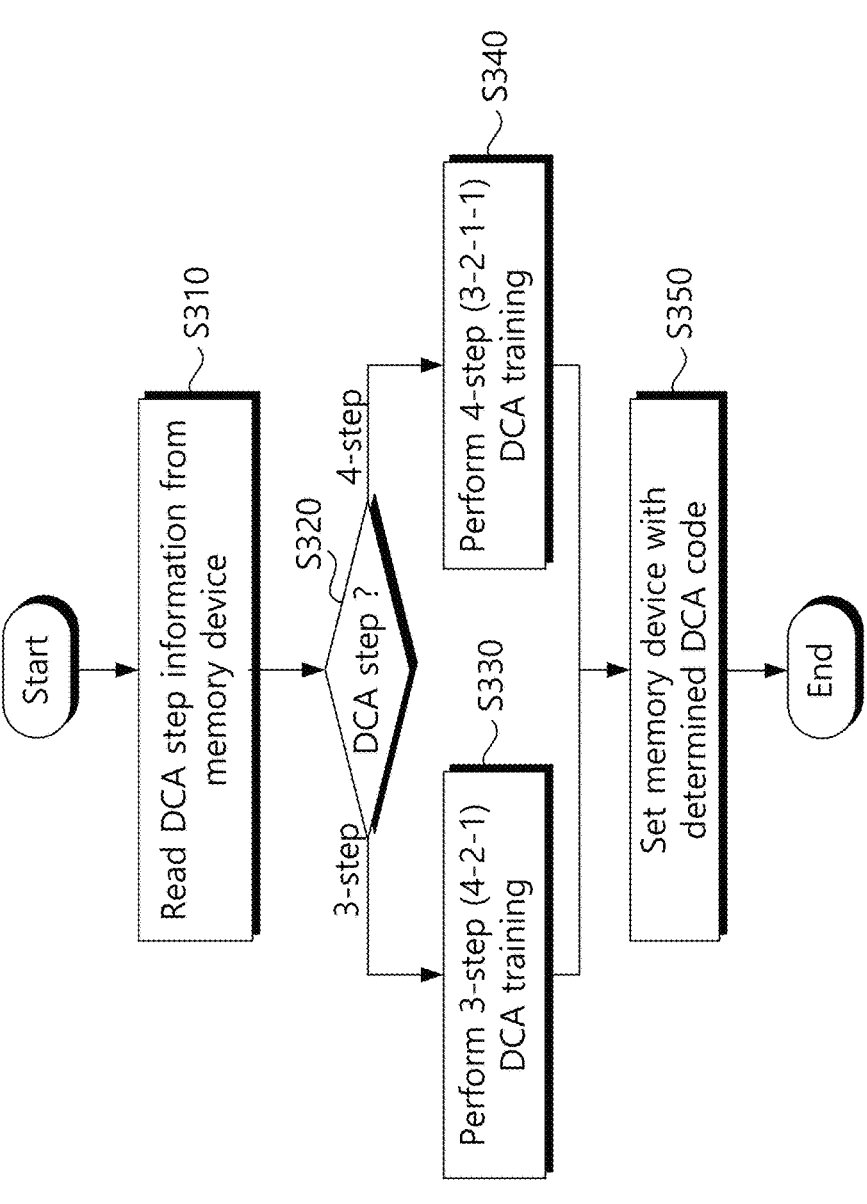
FIG. 15 is a flowchart showing hierarchical DCA training performed in the memory system of FIG. 14.

FIG. 15 is a flowchart showing hierarchical DCA training performed in the memory system of FIG. 14. Referring to FIG. 15, a host 2100 (see FIG. 14) may select a hierarchical DCA training method after reading DCA step information DCA_SI from the memory device 2300 (see FIG. 14).

In operation S310, the host 2100 reads DCA step information DCA_SI from the DCA step register 2390 of the memory device 2300. DCA step information DCA_SI includes information about the hierarchical DCA training method of the memory device 2300.

In operation S320, the host 2100 checks the hierarchical DCA training method using DCA step information DCA_SI. If the hierarchical DCA training method stored in the DCA step information DCA_SI is a 3-step or '4-2-1' manner, the procedure moves to operation S330. On the other hand, if the hierarchical DCA training method indicated in the DCA step information DCA_SI is a 4-step or '3-2-1-1' manner, the procedure moves to operation S340.

In operation S330, the host 2100 performs 3-step hierarchical DCA training on the memory device 2300. For example, the host 2100 will perform hierarchical DCA training in the '4-2-1' manner, which reduces the input size of the DCA code in three steps.

In operation S340, the host 2100 performs 4-step hierarchical DCA training on the memory device 2300. For example, the host 2100 will apply hierarchical DCA training of the '3-2-1-1' manner, which reduces the input size of the DCA code into 4 steps, to the memory device 2300.

In operation S350, the host 2100 sets the memory device 2300 using the improved or optimal DCA code determined through 3-step or 4-step hierarchical DCA training. Once the setting of the memory device 1300 is completed, the hierarchical DCA training of the present invention is completed.

Figure 16:
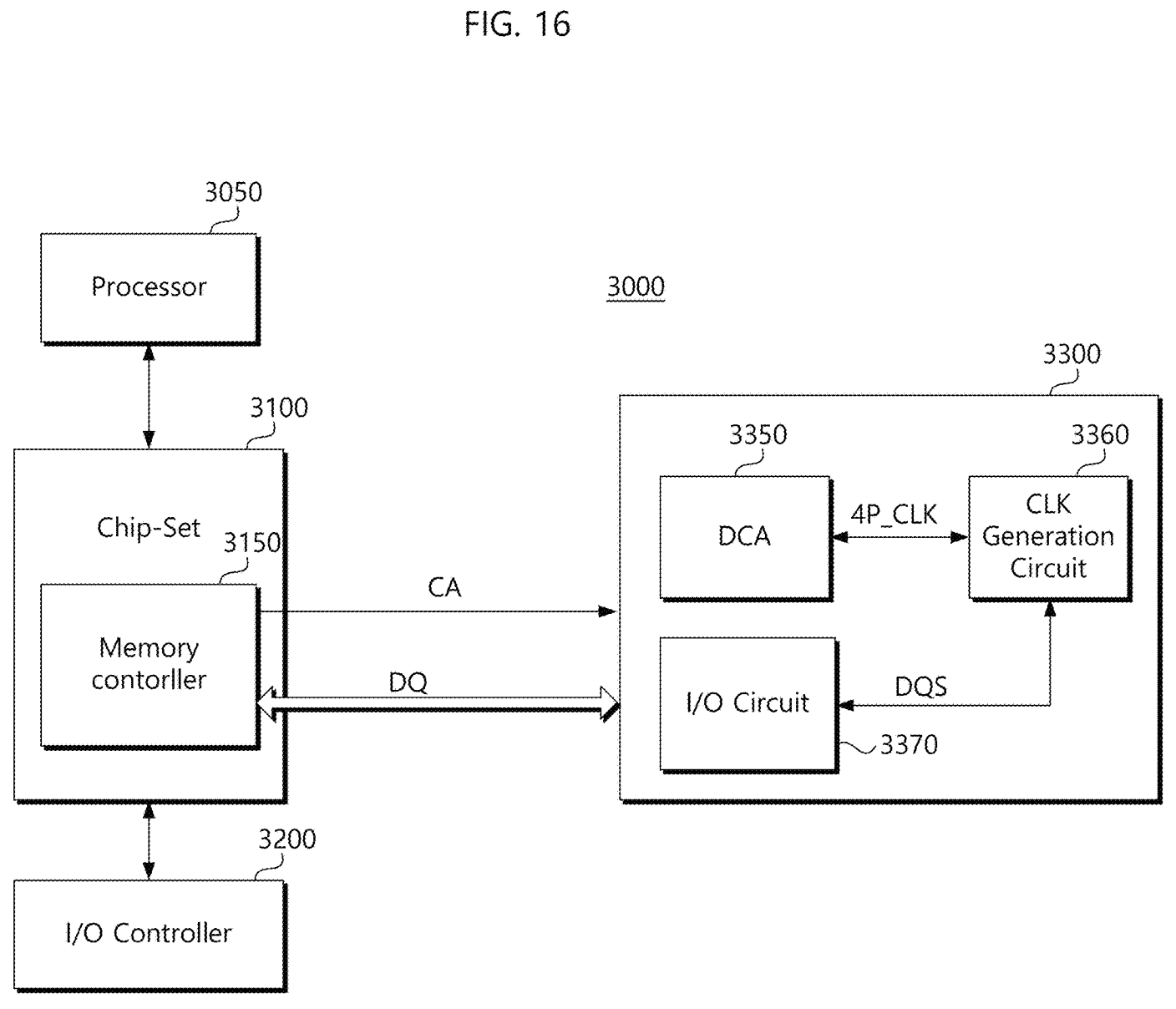

FIG. 16 is a block diagram showing a computing system 3000 according to another embodiment of the present invention. Referring to FIG. 16, the computing system 3000 may include a processor 3050, a chipset 3100, an input/output controller 3200, and a memory device 3300.

The processor 3050 executes software (application programs, operating systems, device drivers, etc.) that runs on the computing system 3000. The processor 3050 will execute an operating system (OS, not shown) loaded into the memory device 2300. The processor 3050 will execute various application programs that will run based on an operating system.

The chipset 3100 controls the connection between the processor 3050, the memory device 3300, and the input/output controller 3200. The chipset 3100 may include a northbridge for controlling the processor 3050 and the memory device 3300 and/or a southbridge for controlling the input/output controller 3200. Alternatively, the chipset 3100 may be provided without distinction between northbridge and southbridge functions.

In particular, the chipset 3100 can apply the hierarchical DCA training of the present invention to the memory device 3300. To this end, the chipset 3100 includes a memory controller 3150 that performs DCA training. The memory controller 3150 can increase the duty cycle adjustment precision by applying 3-step or 4-step hierarchical DCA training to the memory device 3300. In addition, if a tie occurs among the scores at each step of hierarchical DCA training, high accuracy DCA code selection is possible using a tie-break algorithm of various example embodiments. Here, it will be well understood that the function of the chipset 3150 or the function or configuration of the memory controller 3150 may be integrated into the processor 3050.

The input/output controller 3200 controls data flow between the processor 3050 and one or more input/output interfaces (e.g., wired and wireless network interfaces) and I/O devices. For example, the input/output controller 3200 may control data flow between the processor 3050 and at least one of a keyboard, mouse, trackball, pen, touch screen, display, monitor, speaker, and printer. The memory device 3300 may operate substantially the same as the memory device 1300 of FIG. 1 or the memory device 2300 of FIG. 14.

Figure 17:
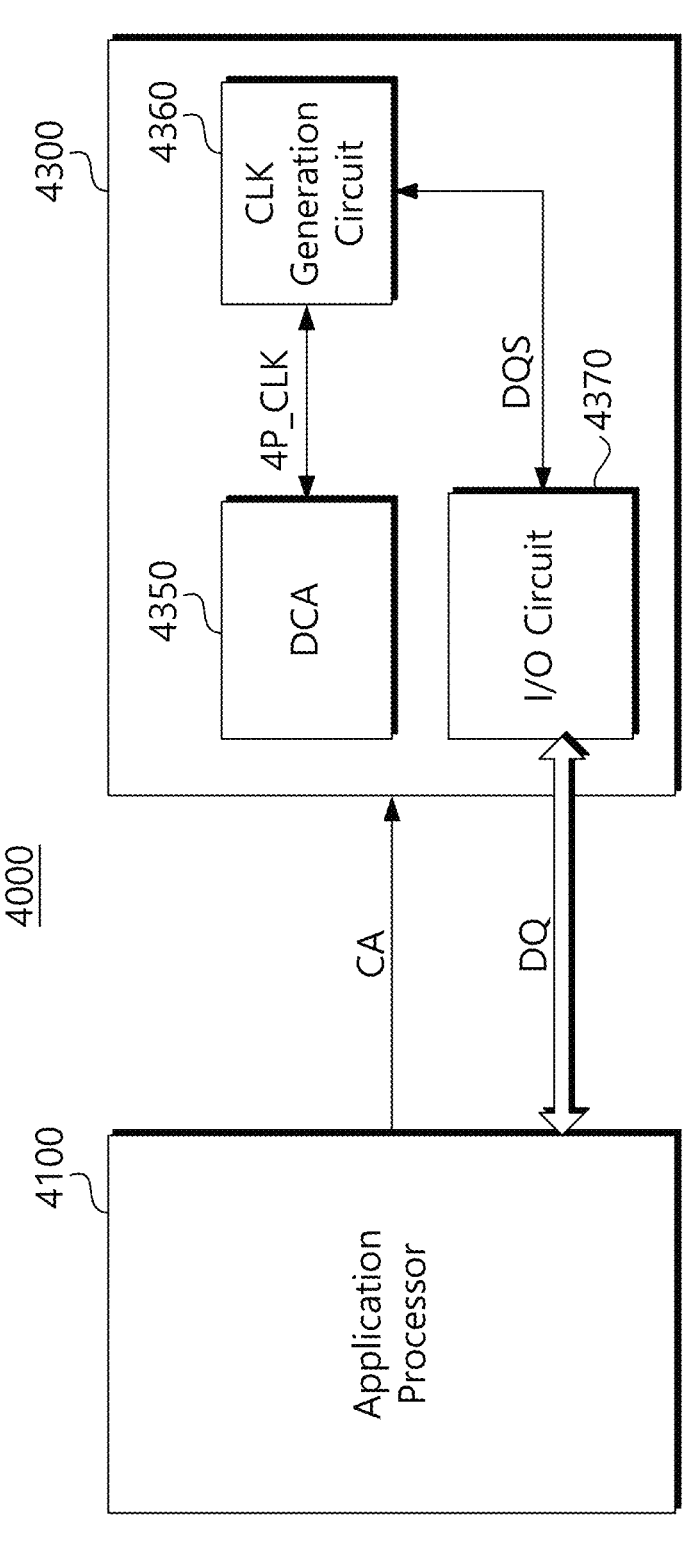
FIG. 17 is a block diagram showing a mobile system according to various example embodiments.

FIG. 17 is a block diagram showing a mobile system according to various example embodiments. Referring to FIG. 17, the computing system 4000 may include an application processor 4100 and a memory device 4300. Here, the memory device 4300 is substantially the same as the memory device 1300 of FIG. 1 or the memory device 2300 of FIG. 14. In this embodiment, the memory device 4300 may be implemented as Low Power DDR (LPDDR) memory improved or optimized for a mobile environment.

The application processor 4100 may apply a hierarchical DCA training of various example embodiments to the memory device 4300. The application processor 4100 can increase the duty cycle adjustment precision by applying 3-step or 4-step hierarchical DCA training to the memory device 4300. In addition, if a tie occurs among the scores at each step of hierarchical DCA training, high accuracy DCA code selection is possible using the tie-break algorithm of the present invention.

Figure 18:
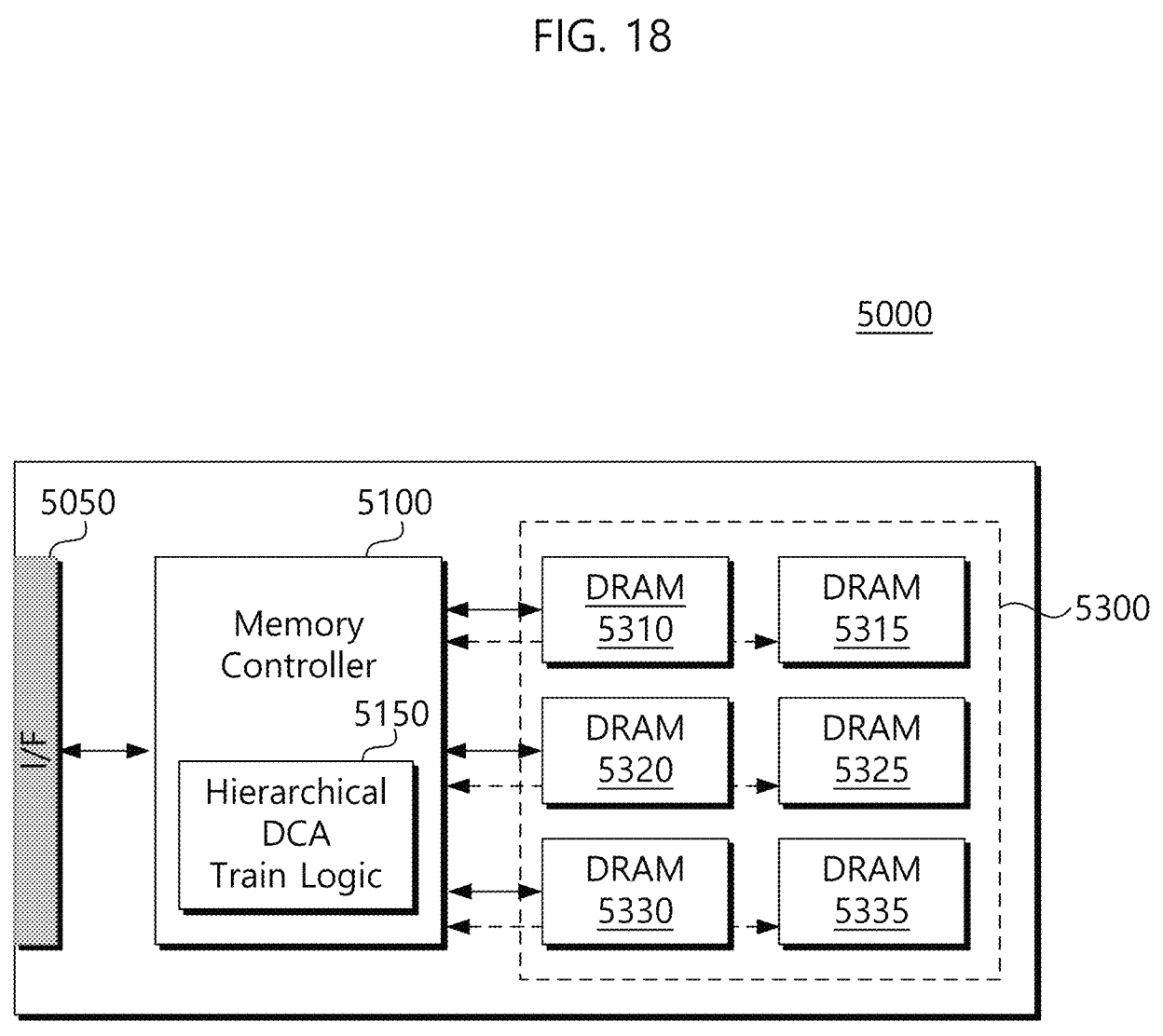

FIG. 18 is a block diagram showing embodiments of a memory system using hierarchical DCA training. Referring to FIG. 18, the memory system 5000 may include an interface 5050, a memory controller 5100, and a plurality of DRAMs 5300.

The hierarchical DCA training technique of the present invention can be applied within the memory system 5000. That is, the memory controller 5100 may include hierarchical DCA train logic 5150 capable of performing hierarchical DCA training of the present invention. For example, the memory system 5000 may be implemented with computer express link (CXL) DRAM. In this case, the memory controller 5100 can secure signal integrity for a plurality of DRAMs 5300 by performing hierarchical DCA training. Alternatively or additionally a method of using the DCA code obtained as a training result as a DCA code during initialization or booting without additional training or with a reduction in probability of using additional training may be applied to the memory system 5000.

Figure 19:
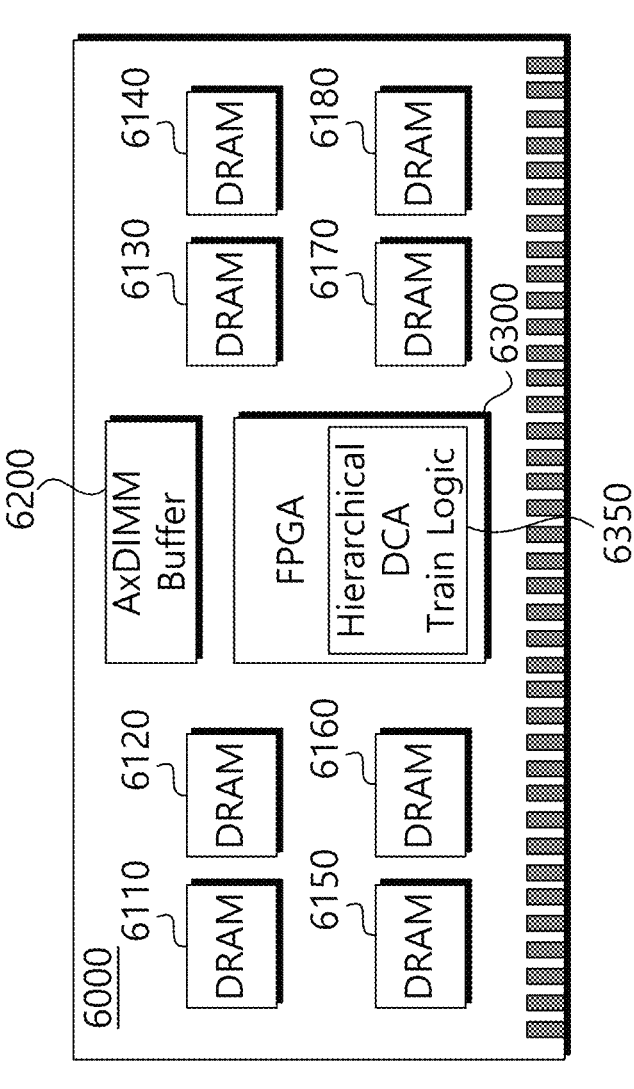
FIG. 19 is a diagram showing a memory system according to various example embodiments.

FIG. 19 is a diagram showing a memory system according to various example embodiments. Referring to FIG. 19, an acceleration double-sided memory module (6000, Acceleration DIMM: hereinafter referred to as AxDIMM) is shown as an example of a memory system equipped with an artificial intelligence engine. The AxDIMM 6000 may include a plurality of DRAM chips (6110 to 6180), AxDIMM buffer 6200, and FPGA 6300.

When the AxDIMM 6000 is booted, firmware or software that performs hierarchical DCA training of the present invention may be loaded into the AxDIMM buffer 6200. Alternatively, as shown, the hierarchical DCA training of the present invention can be applied to a plurality of DRAM chips 6110 to 6180 by the FPGA 6300 including the hierarchical DCA train logic 6350 of the present invention.

Figure 20:
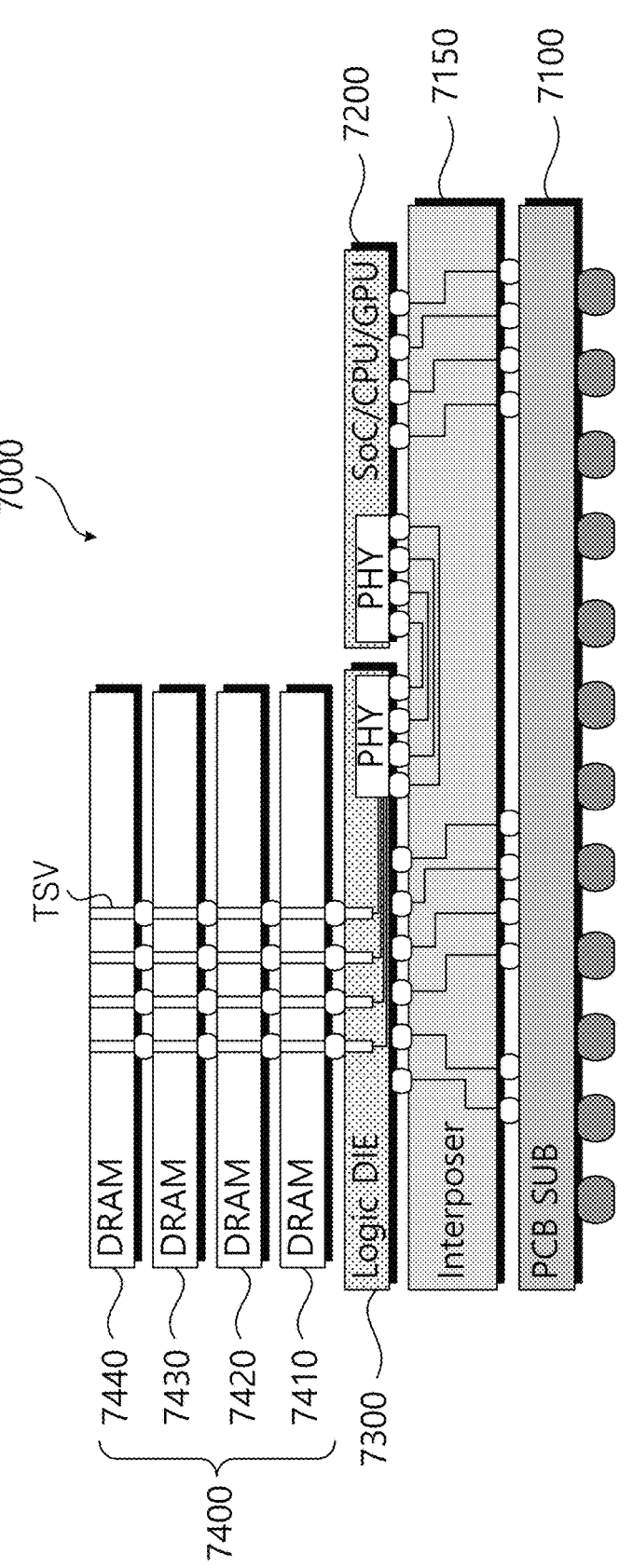
FIG. 20 is a cross-sectional view showing a memory system according to various example embodiments.

FIG. 20 is a cross-sectional view showing a memory system according to various example embodiments. Referring to FIG. 20, a memory system 7000 implemented as a stacked semiconductor device includes a PCB substrate 7100, an interposer 7150, a processor 7200, a logic die 7300, and a plurality of DRAM dies 7410, 7420, 7430, and 7440.

The memory system 7000 connects the high-bandwidth memory 7400 and the processor 7200 using an interposer 7150. The interposer 7150 is disposed on the upper part of the PCB board 7100 and is electrically connected to the PCB board 7100 through flip chip bumps FB. The interposer 7150 may connect the logic die 7300 and the processor 7200. The interposer 7150 connects the physical layer 7350 of the logic die 7300 and the physical layer 7250 of the processor 7200 and may provide physical paths formed using conductive materials. Accordingly, the logic die 7300 and the processor 7200 can transmit and receive signals to each other through the interposer 7150.

In some example embodiments, processor 7200 may write a DCA code to adjust the duty cycle of the four quadrature internal clock signals ICLK, QCLK, IBCLK, and QBCLK of high-bandwidth memory 7400. The processor 7200 may apply hierarchical DCA training to internal clock signals. In addition, if a tie occurs among the scores at each step of hierarchical DCA training, high accuracy DCA code selection is possible using the tie-break algorithm of the present invention.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Furthermore any or all of the elements described with reference to various figures may communicate with any or all other elements described with reference to respective figures. For example, any element may engage in one-way and/or two-way and/or broadcast communication with any or all other elements in some figures, to transfer and/or exchange and/or receive information such as but not limited to data and/or commands, in a manner such as in a serial and/or parallel manner, via a bus such as a wireless and/or a wired bus (not illustrated). The information may be in encoded various formats, such as in an analog format and/or in a digital format.

The above are specific example embodiments for carrying out inventive concepts. In addition to the above-described example embodiments, inventive concepts may include simple design changes and/or easily changeable embodiments. Alternatively or additionally, inventive concepts may include techniques that can be easily modified and implemented using example embodiments. Therefore, the scope of inventive concepts should not be limited to the above-described example embodiments, and should be defined by the claims and equivalents of the claims of example embodiments as well as the claims to be described later. Furthermore, example embodiments are not necessarily mutually exclusive with one another. For example, some example embodiments may include one or more features described with reference to one or more figures, and may also include one or more other features described with reference to one or more other figures.

What is claimed is:

1. A method of training a memory device to adjust an eye window of a data signal according to a written duty cycle adjuster (DCA) code, the method comprising:

performing a first DCA training step on the memory device using first DCA code combinations with a first offset size, the first DCA training adjusting duty cycles of each of internal clock signals QCLK, IBCLK, and QBCLK according to the first DCA code combinations;

performing a second DCA training step on the memory device using second DCA code combinations with a second offset size under conditions in which the memory device is set according to a result of the first DCA training step; and performing a third DCA training step on the memory device using third DCA code combinations with a third offset size under conditions in which the memory device is set according to a result of the second DCA training step, wherein in the first DCA training step, the second DCA training step, and the third DCA training steps, the method includes calculating a score for each of the first DCA code combinations, the second DCA code combinations, and the third DCA code combinations based on an eye window size of the data signal, and in response to a tie occurring among scores, the method includes selecting a DCA code combination based on a sum of an even-eye window minimum value and an odd-eye window minimum value of the data signal.

2. The method of claim 1, wherein the first DCA training step comprises:

writing each of the first DCA code combinations into the memory device and measuring the eye window sizes of data signals corresponding to each of the first DCA code combinations from the memory device; and calculating the score for each of the first DCA code combinations based on the eye window sizes.

3. The method of claim 2, wherein the score corresponds to a minimum value among the eye window sizes of four consecutive unit intervals of the data signal.

4. The method of claim 1, wherein the first offset size is at least one of '−4', '0', and '4', the second offset size is at least one of '−2', '0', and '2', and the third offset size is at least one of '−1', '0', and '1'.

5. The method of claim 1, further comprising:

performing a fourth DCA training step on the memory device using fourth DCA code combinations with a fourth offset size.

6. The method of claim 5, wherein the first offset size corresponds to at least one of '−3', '0', and '3', the second offset size corresponds to at least one of '−2', '0', and '2', the third offset size corresponds to at least one of '−1', '0', and '1', and the fourth offset size corresponds to at least one of '−1', '0', and '1'.

7. The method of claim 1, wherein each of the first DCA code combinations, the second DCA code combinations, and the third DCA code combinations include 27 cases.

8. The method of claim 1, wherein the data signal in the first DCA training step, the second DCA training step, and the third DCA training steps is output based on a pseudo-random binary sequence PRBS.

9. A memory system configured to adjust duty cycle of four internal clock signals through a duty cycle adjuster (DCA) code, comprising:

a memory device configured to generate a data signal or a data strobe signal with duty cycle changes in response to the DCA code; and a memory controller configured to perform hierarchical DCA training on the memory device to select an improved DCA code and set the memory device using the improved DCA code, wherein the memory controller is configured to perform a first DCA training step on the memory device using first DCA code combinations with a first offset size to adjust the duty cycle of each of the four internal clock signals according to the first DCA code combinations, and to perform a second DCA training step on the memory device using second DCA code combinations with a second offset size under conditions in which the memory device is set according to a result of the first DCA training step.

10. The memory system of claim 9, wherein the memory controller is configured to perform a third DCA training step on the memory device using third DCA code combinations with a third offset size under conditions in which the memory device is set according to a result of the second DCA training step.

11. The memory system of claim 10, wherein the memory controller is configured to calculate scores of each of the first DCA code combinations, the second DCA code combinations, and the third DCA code combinations based on an eye window size of the data signal in the first DCA training step, the second DCA training step, and the third DCA training steps.

12. The memory system of claim 11, wherein in response to a tie occurring among the scores, the memory controller is configured to select an improved DCA code combination based on a sum of a minimum even-eye window value and a minimum odd-eye window value of the data signal.

13. The memory system of claim 10, wherein the first offset size corresponds to at least one of '−4', '0', and '4', the second offset size corresponds to at least one of '−2', '0', and '2', and the third offset size corresponds to at least one of '−1', '0', and '1'.

14. The memory system of claim 10, wherein the memory controller is configured to perform a fourth DCA training step on the memory device using fourth DCA code combinations with a fourth offset size under conditions in which the memory device is set according to a result of the third DCA training step.

15. The memory system of claim 14, wherein the first offset size corresponds to at least one of '−3', '0', and '3', the second offset size corresponds to at least one of '−2', '0', and '2', the third offset size corresponds to at least one of '−1', '0', and '1', and the fourth offset size corresponds to at least one of '−1', '0', and '1'.

16. The memory system of claim 12, wherein the memory device includes a DCA step register configured to store information of a number of steps in the hierarchical DCA training.

17. The memory system of claim 16, wherein the memory controller is configured to read the DCA step register to determine the number of steps used for the hierarchical DCA training.

18. A method of training a memory device, comprising:
performing first duty cycle adjuster (DCA) training on the memory device using first DCA code combinations with a first offset size to adjust the duty cycle of each of a plurality of internal clock signals according to the first DCA code combinations; and
performing second DCA training on the memory device using second DCA code combinations with a second offset size under conditions in which the memory device is set according to a results of the first DCA training,
wherein a maximum value of the first offset size is greater than maximum value of the second offset size, and the method includes calculating scores based on eye window size of data signal corresponding to each of the first DCA code combinations and the second DCA code combinations in the first DCA training and the second DCA training.

19. The method of claim 18, wherein in response to a tie occurring among the scores, the method includes selecting an improved DCA code combination based on a sum of an even-eye window minimum value and an odd-eye window minimum value of the data signal.

20. The method of claim 18, wherein the method includes outputting the data signal from the memory device based on a pseudo-random binary sequence (PRBS) in the first DCA training and the second DCA training.

* * * * *